(12) United States Patent
Jang et al.

(10) Patent No.: US 12,040,819 B2
(45) Date of Patent: Jul. 16, 2024

(54) METHOD AND APPARATUS FOR DECODING OF DATA IN COMMUNICATION AND BROADCASTING SYSTEMS

(71) Applicant: Samsung Electronics Co., Ltd., Suwon-si (KR)

(72) Inventors: Min Jang, Suwon-si (KR); Kyeongyeon Kim, Suwon-si (KR); Seho Myung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/871,506

(22) Filed: Jul. 22, 2022

(65) Prior Publication Data

US 2023/0059393 A1    Feb. 23, 2023

(30) Foreign Application Priority Data

Aug. 2, 2021  (KR) .................. 10-2021-0101387

(51) Int. Cl.
*H03M 13/11* (2006.01)
*H04L 1/00* (2006.01)

(52) U.S. Cl.
CPC .... *H03M 13/1125* (2013.01); *H03M 13/1128* (2013.01); *H04L 1/0057* (2013.01)

(58) Field of Classification Search
CPC ......... H03M 13/1125; H03M 13/1128; H03M 13/6502; H03M 13/1185; H03M 13/116; H03M 13/1117; H03M 13/114; H03M 13/618; H03M 13/1111; H03M 13/1102; H04L 1/0057; H04L 1/005; H04L 1/0054; H04L 1/0061

See application file for complete search history.

(56) References Cited

U.S. PATENT DOCUMENTS 9,250,994 B1 *    2/2016  Vakilinia ............ H03M 13/1171
2005/0149842 A1 * 7/2005  Kyung ............... H03M 13/2963
                                                       714/800
2009/0313525 A1 * 12/2009 Savin .................... H03M 13/114
                                                       714/752

(Continued)

FOREIGN PATENT DOCUMENTS

KR    10-2017-0105314 A    9/2017
KR    10-2020-0127783 A   11/2020

*Primary Examiner* — Steve N Nguyen
(74) *Attorney, Agent, or Firm* — Jefferson IP Law, LLP

(57) ABSTRACT

The disclosure relates to a method performed by an apparatus for decoding an encoded signal in a communication system according to an embodiment of the disclosure may include an operation of receiving an encoded signal including a plurality of codeword bits, an operation of determining a first log-likelihood ratio (LLR) for the plurality of codeword bits, and an operation of performing iterative decoding a predetermined number of times based the first LLR, and the plurality of codeword bits may include a codeword bit included in a first subset and a codeword bit included in a second subset, and the operation of performing iterative decoding may include determining a second LLR only for the codeword bit included in the first subset of the plurality of codeword bits, and estimating, based on the second LLR, a bit value only for the codeword bit included in the first subset.

10 Claims, 16 Drawing Sheets

(56) References Cited

U.S. PATENT DOCUMENTS

| | | |
|---|---|---|
| 2012/0260144 A1* | 10/2012 | Varanasi .............. H03M 13/118 |
| | | 714/755 |
| 2013/0198591 A1* | 8/2013 | Kamuf .............. H03M 13/6577 |
| | | 714/780 |
| 2014/0153628 A1* | 6/2014 | Vojcic ................ H03M 13/612 |
| | | 375/227 |
| 2017/0264313 A1 | 9/2017 | Lee et al. |
| 2017/0264316 A1* | 9/2017 | Lee ................... H03M 13/1128 |
| 2020/0350927 A1 | 11/2020 | Jang et al. |
| 2021/0119734 A1* | 4/2021 | Mheich .................. H04L 27/26 |

* cited by examiner

FIG. 3

$$H = \begin{bmatrix} 1 & 1 & 1 & 1 & 0 & 1 & 1 & 0 & 0 & 0 \\ 0 & 0 & 1 & 1 & 1 & 1 & 1 & 1 & 0 & 0 \\ 0 & 1 & 0 & 1 & 0 & 1 & 0 & 1 & 1 & 1 \\ 1 & 0 & 1 & 0 & 1 & 0 & 0 & 1 & 1 & 1 \\ 1 & 1 & 0 & 0 & 1 & 0 & 1 & 0 & 1 & 1 \end{bmatrix}$$

FIG. 6B

| 9 | 117 | 204 | 26 | | 189 | | | 205 |
|---|---|---|---|---|---|---|---|---|
| 167 | | | 166 | 253 | 125 | 226 | 156 | 224 | 252 |
| 81 | 114 | | 44 | 52 | | | 240 | |
| | 8 | 58 | | 158 | 104 | 209 | 54 | 18 | 128 |

| 0 | 0 |   |   |
|---|---|---|---|
|   | 0 | 0 |   |
| 1 |   | 0 | 0 |
| 0 |   |   | 0 |

| | | | | | | | | | |
|---|---|---|---|---|---|---|---|---|---|
|179|214| | | | | | |71| |
|231|41| | |194|159| | |103| |
|155| | | |228|45| |28|158| |
| |129| | |147|140| | |3|116|
|142|94| | | | | | | |230|
| |203| | | | |205| |61|247|
|11|185| | | |0|117| | | |
|11| | | | |236| |210| | |56|
| |63|111| | | | | |14| |
|83|2| | | | |38| | |222|
| |115| | |145| | | |3|232|
|51| | | | | | | |175|213|
| |203| | | | | |142|8|242|
| |254| |124| | | | |114|64|
|220| | | |194|50| | | | |
|87|20| | | | | | |185| |
| |26| |105| | | | |29| |
|76| | | | |42| | | |210|
| |222|63| | | | | | | |
|23| |235|238| | | | | | |
| |46|139| | | |8| | | |
|228| | |156| | | | | | |
| |29| | | |143| | |160|122|
|8| | | |151| | | | | |
| |98|101| |135| | | | | |
|18| | |28| | | | | | |
| |71| |240| |9| |84| | |
| |106| | | | | | | |1|
|242| | |44| | | | |166| |
| |132| | |164| |235| | | |
|147| | | | | | | |85|36|
| |57| |40| | | | |63| |
|140|38| | |154| | | | | |
| | | | | | | |219| |151|
| |31| |66| | | | |38| |
|239| | | |172| | | |34| |
| |0| | | | | |75| |120|
| |129| |229| | | | |118| |

C (604)

I (605)

METHOD AND APPARATUS FOR DECODING OF DATA IN COMMUNICATION AND BROADCASTING SYSTEMS

CROSS-REFERENCE TO RELATED APPLICATION(S)

This application is a continuation application, claiming priority under § 119(a) of a Korean patent application number 10-2021-0101387, filed on Aug. 2, 2021, in the Korean Intellectual Property Office, the disclosure of which is incorporated by reference herein in its entirety.

TECHNICAL FIELD

The disclosure relates to error-correcting codes that correct or restore data when an error is caused or data loss occurs due to various factors such as noise, interference, or the like in the process of transmitting or storing data. More particularly, the disclosure relates to decoding of a low-density parity-check (LDPC) code, and relates to efficiently implementing a method, a procedure, and an apparatus for receiving and decoding a signal transmitted from a mobile communication system and a broadcasting system.

BACKGROUND ART

To meet the demand for wireless data traffic having increased since deployment of fourth generation (4G) communication systems, efforts have been made to develop an improved fifth generation (5G) or pre-5G communication system. Therefore, the 5G or pre-5G communication system is also called a "beyond 4G network" communication system or a "post long-term evolution (post LTE)" system. The 5G communication system is considered to be implemented in ultrahigh frequency (millimeter wave (mmWave)) bands (e.g., 60 GHz bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, hybrid frequency shift keying (FSK) and quadrature amplitude modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

The Internet, which is a human centered connectivity network where humans generate and consume information, is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology (IT) services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (cloud RAN) as the above-described big data processing technology may also be considered an example of convergence of the 5G technology with the IoT technology.

In general, when a transmitter and a receiver perform data transmission and reception in a communication and broadcasting system, a data error may occur due to noise existing in a communication channel. As an encoding scheme that is designed to enable a receiver to correct an error caused by a communication channel, there are an error detection codes scheme and an error correcting codes (ECC) scheme. Particularly, an error correction code used in communication between a transmitter and a receiver is generally referred to as a channel coding or forward error correction (FEC). A transmitter may produce and transmit a codework bit sequence having a relatively long length by encoding a data bit sequence desired to be transmitted, and a receiver may decode a codeword bit sequence mixed with errors or noises and may estimate a data bit sequence by overcoming errors/noises.

In the communication and broadcasting system, various channel coding schemes are used. The channel coding schemes used these days may include a convolutional code, a turbo code, a low-density parity-check coding (LDPC code), a polar code, and the like. If the length of a code is increased, an LDPC code among the channel coding schemes will show an excellent error correction performance when compared to other channel coding schemes. In addition, in the case of the LDPC code, an encoding structure and a belief-propagation (BP) decoding operation associated therewith are appropriate for parallelization and thus, it may be appropriate for being used in an application system that requires a high-throughput. Due to the benefits, LDPC codes may be used in various communication and broadcasting systems such as IEEE 802.11n/ad wireless fidelity (Wi-Fi), DVB-T2/C2/S2, advanced television systems committee (ATSC) 3.0, and the like. Particularly, the LDPC codes has been recently adapted and used by the third generation partnership project (3GPP) New Radio (NR) system that is the 5G mobile communication system. The disclosure relates to efficiently decoding a signal encoded into an LDPC code.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide a method and apparatus for efficiently decoding a low-density parity-check (LDPC) code in a communication or broadcasting system. Particularly, the disclosure relates to efficient decoding of an LDPC code configured by 2 steps including a precoder and single parity-check extension, or efficient decoding of an LDPC code having a structure equivalent thereto. Such LDPC code structured as described above may be appropriate for flexibly supporting various code rates with greater error-correction performance based on a single mother code. Particularly, a high error-correction performance may be shown at a low code rate. As an example of an LDPC code having such structure may include an LDPC code used in the 5G communication system, an LDPC code used in ATSC 3.0 broadcasting system, and the like.

When compared to another channel coding scheme, the LDPC code has a structure appropriate for parallelization, and may support a high decoding throughput. However, as the communication and broadcasting system that supports a high data transmission rate (data rate), such as 5G, next generation broadcasting system, and the like, has been standardized and commercialized, a decoder of an LDPC code has been required to support a higher decoding throughput. For example, if a 5G NR system supports a data transmission rate of several tens of Gbps, and this refers to that an LDPC decoder needs to estimate and calculate several billions of bits ($\geq 10^9$) per second. A channel decoder receives a log-likelihood ratio (LLR) sequence for an encoded codeword bit sequence, and thus, actually, the LDPC decoder may need to process LLR several times greater than the number of data bit sequences (before being decoded). Accordingly, an LDPC code is good at high-speed decoding when compared to other channel codes. However, the structure and the performance of a decoder may need to be improved since 5G and beyond-5G communication and broadcasting system support a higher data transmission rate.

The disclosure is to reduce an unnecessary operations and devices in consideration of the structure of an LDPC code, so as to improve a decoding speed and a decoding throughout. In addition, if a hardware-based LDPC decoder such as field programmable gate array (FPGA), application specific integrated circuit (ASIC), system on chip (SoC), or the like is configured, the LDPC decoder may need to be efficiently embodied with a smaller hardware area such as a smaller chip, a smaller memory, a smaller processor, or the like. The disclosure may be applied to a communication and broadcasting system, such as 5G NR system, ATSC 3.0 system, or the like, that uses an LDPC code having a 2-step structure (precoder+extension) and an LDPC code having a structure equivalent thereto.

Additional aspects will be set forth in part in the description which follows and, in part, will be apparent from the description, or may be learned by practice of the presented embodiments.

Technical Solution

In accordance with an aspect of the disclosure, a method performed by an apparatus for decoding an encoded signal in a communication system is provided. The method includes an operation of receiving an encoded signal including a plurality of codeword bits, an operation of determining a first log-likelihood ratio (LLR) for the plurality of codeword bits, and an operation of performing iterative decoding a predetermined number of times based the first LLR, wherein the plurality of codeword bits may include a codeword bit included in a first subset and a codeword bit included in a second subset, and the operation of performing iterative decoding may include determining a second LLR only for the codeword bit included in the first subset of the plurality of codeword bits, and estimating, based on the second LLR, a bit value only for the codeword bit included in the first subset.

According to an embodiment, the operation of performing the iterative decoding may include determining whether the iterative decoding is successfully performed based on a bit value estimated for the codeword bit belonging to the first subset.

According to an embodiment, the operation of performing iterative decoding may include skipping determining a second LLR for the codeword bit included in the second subset of the plurality of codeword bits, and skipping estimating a bit value for the codeword bit included in the second subset.

According to an embodiment, the first subset may include a codeword bit corresponding to a variable node of which a degree is greater than or equal to 2 in a predetermined code graph for the iterative decoding, and the second subset may include a codeword bit corresponding to a variable node of which a degree is 1 in the code graph.

According to an embodiment, the plurality of codeword bits may be constructed via concatenation of a first code and a second code, and the first subset may include a first parity bit produced based on the first code, and the second subset may include a second parity bit produced based on the second code.

According to an embodiment, the first parity bit may be produced based on a precoder, and the second parity bit may be produced based on single parity check extension (SPC extension).

According to an embodiment, whether the iterative decoding is successfully performed may be determined based on a syndrome check, and the syndrome check may be performed on an index associated with the codeword bit included in the first subset.

In accordance with another aspect of the disclosure, an apparatus for decoding an encoded signal in a communication system is provided. The apparatus includes a transceiver and at least one processor configured to perform control so as to receive an encoded signal including a plurality of codeword bits, to determine a first log-likelihood ratio (LLR) for the plurality of codeword bits, and to perform iterative decoding a predetermined number of times based on the first LLR, and the plurality of codeword bits may include a codeword bit included in a first subset and a codeword bit included in a second subset, and the at least one processor may be configured to determine a second LLR only for the codeword bit included in the first subset of the plurality of codeword bits, and to estimate a bit value for a codeword bit included in the first subset based on the second LLR.

Advantageous Effects

A method and apparatus according to various embodiments of the disclosure can decode, with a low operation complexity and low processing time, an LDPC code embodied as software in a general-purpose process such as a central processing unit (CPU), graphics processing unit (GPU), and the like. In addition, a method and apparatus according to various embodiments of the disclosure may not cause a loss of error-correction performance and error-detection performance of an LDPC decoder.

A method and apparatus according to various embodiments of the disclosure can use a smaller chip, a smaller memory, a smaller processor, or the like to configure a decoder of an LDPC code as a semiconductor hardware such as FPGA, ASIC, SoC, or the like. Therefore, a method and apparatus according to various embodiments of the disclosure can embody an LDPC decoder in smaller-size hardware that provides the same performance. In addition, the LDPC decoder embodied as hardware according to the disclosure can consume low power and can spend a short processing time and delay time, and may not cause a loss in error-correction performance and error-detection performance.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which:

FIG. 3 is a diagram illustrating an embodiment of a parity check matrix of an LDPC code according to an embodiment of the disclosure;

FIG. 6B is diagram illustrating an example of a submatrix included in a parity check matrix according to an embodiment of the disclosure;

FIG. 6C is diagram illustrating an example of a submatrix included in a parity check matrix according to an embodiment of the disclosure;

FIG. 6E is diagram illustrating an example of a submatrix included in a parity check matrix according to an embodiment of the disclosure;

Throughout the drawings, it should be noted that like reference numbers are used to depict the same or similar elements, features, and structures.

MODE FOR INVENTION

Figure 1:
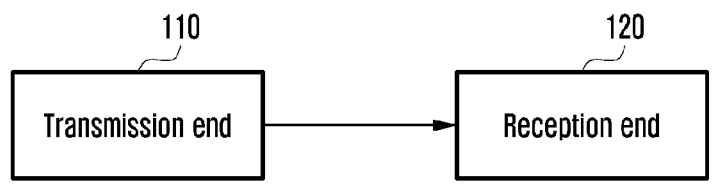
FIG. 1 is a diagram illustrating a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In describing embodiments of the disclosure, descriptions related to technical contents well-known in the art and not associated directly with the disclosure will be omitted. Such an omission of unnecessary descriptions is intended to prevent obscuring of the main idea of the disclosure and more clearly transfer the main idea.

For the same reason, in the accompanying drawings, some elements may be exaggerated, omitted, or schematically illustrated. Further, the size of each element does not completely reflect the actual size. In the drawings, identical or corresponding elements are provided with identical reference numerals.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Herein, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Further, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, the "unit" refers to a software element or a hardware element, such as a Field Programmable Gate Array (FPGA) or an Application Specific Integrated Circuit (ASIC), which performs a predetermined function. However, the "unit" does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, or a "unit", or divided into a larger number of elements, or a "unit". Moreover, the elements and "units" or may be implemented to reproduce one or more CPUs within a device or a security multimedia card.

Hereinafter, various embodiments will be described with reference to attached drawings. In this instance, it should be understood that the like reference numerals refer to like elements. In addition, drawings attached are merely provided for a better understanding of the disclosure, it should be construed that the disclosure is not limited to the forms or dispositions illustrated in the drawing. Further, a detailed description of a known function and configuration which may make the subject matter of the disclosure unclear will be omitted. Hereinafter, it should be noted that only the descriptions will be provided that may help understanding the operations provided in association with the various embodiments of the disclosure, and other descriptions will be omitted to avoid making the subject matter of the disclosure rather unclear.

FIG. 1 is a diagram illustrating a wireless communication system according to an embodiment of the disclosure.

Referring to FIG. 1, a transmission end 110 and a reception end 120 may be included in as a part of devices or nodes that use a wireless channel in a wireless communication system according to an embodiment of the disclosure. Although FIG. 1 illustrates a single transmission end 110 and a single reception end 120, this is merely an example, and the disclosure may be applied to a communication system including a plurality of transmission ends or a plurality of reception ends. In addition, for ease of description, the transmission end 110 and the reception end 120 are described as separate entities but the function of the transmission end 110 and the function of the reception end 120 may be changed to each other. That is, depending on the situation, the transmission end of FIG. 1 may function as the reception end, and the reception end may function as the transmission end. For example, in the case of a cellular communication system, transmission end 110 may be a terminal, and the reception end 120 may be a base station, in an uplink. In the case of a downlink, the transmission end 110 may be a base station, and the reception end 120 may be a terminal. Alternatively, in the case of a sidelink, both the transmission end 110 and the reception end 120 may be terminals.

According to various embodiments, the transmission end 110 may encode information bits based on an LDPC code so as to produce a codeword, and the reception end 120 may decode a signal of a received codeword based on an LDPC code. For example, the reception end 120 may decode a signaled codeword using an LDPC decoding scheme according to the disclosure, and may perform a syndrome check in order to determine whether a decoding result is normal. The transmission end 110 and the reception end 120 may perform LDPC encoding and decoding using a parity check matrix that they both are aware of. The parity check matrix may include a parity check matrix defined in the 5G NR standard, for example, TS 38.212, and the like.

Figure 2:
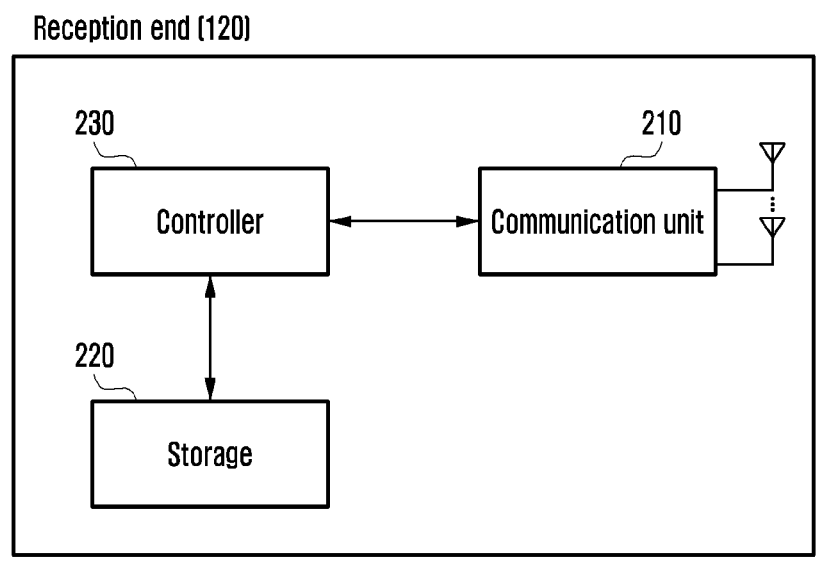
FIG. 2 is a diagram illustrating an example of the configuration of an apparatus that performs communication in a wireless communication system according to an embodiment of the disclosure.

FIG. 2 is a diagram illustrating an example of the configuration of an apparatus that performs communication in a wireless communication system according to an embodiment of the disclosure. Although FIG. 2 illustrates the configuration of the reception end 120, it is construed that the configuration of the transmission end 110 also has a similar configuration thereto. The term ' . . . unit' or the ending of a word, such as ' . . . or', ' . . . er', or the like may indicate a unit of processing at least one function or operation, and this may be embodied by hardware, software, or a combination of hardware and software.

Referring to FIG. 2, the apparatus may include a communication unit 210, a storage 220, and a controller 230.

The communication unit 210 may perform functions for transmitting or receiving a signal via a wireless channel. For example, the communication unit 210 may perform a function of conversion between a baseband signal and a bit stream according to the physical layer standard of a system. For example, in the case of data transmission, the communication unit 210 may produce complex symbols by encoding and modulating a transmission bit stream. In addition, in the case of data reception, the communication unit 210 may restore a reception bit stream by demodulating and decoding a baseband signal. In addition, the communication unit 210 may up-convert a baseband signal into a radio frequency (RF) band signal and may transmit the same via an antenna, and may down-convert an RF band signal received via an antenna into a baseband signal.

To this end, the communication unit 210 may include a transmission filter, a reception filter, an amplifier, a mixer, an oscillator, a digital-to-analog convertor (DAC), an analog-to-digital convertor (ADC), and the like. In addition, the communication unit 210 may include a plurality of transmission/reception paths. In addition, the communication unit 210 may include at least one antenna array including a plurality of antenna elements. From the perspective of hardware, the communication unit 210 may be configured with a digital unit and an analog unit. The analog unit may include a plurality of sub-units depending on operating power, an operating frequency, or the like. In addition, the communication unit 210 may include a decoder for performing decoding according to various embodiments of the disclosure.

The communication unit 210 may transmit or receive a signal as described above. Accordingly, the communication unit 210 may also be referred to as a 'transmitter', a 'receiver', or a 'transceiver'. In addition, in the following descriptions, the transmission and reception performed via a wireless channel may be used as a meaning indicating that the above-described processing is performed by the communication unit 210. In addition, if the apparatus of FIG. 2 is a base station, the communication unit 210 may further include a backhaul communication unit for performing communication with another network entity connected via a backhaul network.

The storage 220 may store data such as basic programs, application programs, configuration information, and the like for operation of the reception end 120. The storage 220 may be embodied as volatile memory, nonvolatile memory, or a combination of volatile memory and nonvolatile memory. In addition, the storage 220 may provide data stored therein in response to a request from the controller 230.

The controller 230 may control overall operation of the apparatus. For example, the controller 230 may perform signal transmission and reception via the communication unit 210. Further, the controller 230 may record data in the storage 220 and may read the recorded data. To this end, the controller 230 may include at least one processor or microprocessor, or may be a part of the processor. According to various embodiments, the controller 230 may perform control so that the apparatus performs operations according to various embodiments described below.

Hereinafter, unless otherwise noted, various symbols or terms used in the process of describing the disclosure in details may be understood as generally used symbols. An LDPC code may be a linear code, and may be normally defined by a parity-check matrix. It is assumed that the number of information bits (also referred to as a code dimension) to be encoded using an LDPC code is K, and the number of codeword bits (a code length), which is the result of encoding, is N. The information bit sequence with a length of to be encoded may be a codeword sequence encoded by an outer coding such as a cyclic redundancy check (CRC) code or the like. If $\mathbb{F}_2$ is a binary field, a codeword bit vector having a code length of N may be expressed as $x=(x_1, x_2, \ldots, x_N) \in \mathbb{F}_2^{1 \times N}$ (defined as a row vector). If a parity check matrix is given as $H \in \mathbb{F}_2^{(N-K) \times N}$, a codeword bit vector may be produced to satisfy the equation shown below.

(pairty check equation) $Hx^T=0$     Equation 1

In Equation 1, $0 \in \mathbb{F}_2^{N-K}$ denotes a zero vector. According to Equation 1, a codeword bit vector x of an LDPC code defined by the parity check matrix H may be a nullspace for the parity check matrix H. A $j^{th}$ row of H is expressed as $h_j \in \mathbb{F}_2^{1 \times N}$ (a row vector), and the element at a $j^{th}$ row and an $i^{th}$ column of H is expressed as $h_{ji} \in \mathbb{F}_2$. Encoding and decoding of an LDPC code may be performed based on the parity check matrix H.

Given the situation in which a decoder of a receiver performs a series of operations, and $\hat{x}$ is estimated that is obtained by adding a binary error to a codeword bit vector x, description will be provided. The estimated codeword bit vector $\hat{x}$ may be expressed as $x \oplus e$ which is obtained by adding $e \in \mathbb{F}_2^{1 \times N}$ that is an error vector having an error location value of 1 to the codeword bit vector x. Here, $\oplus$ is a binary addition (modulo-2 sum or bitwise-XOR). In this instance, the binary multiplication of the parity check matrix H and the estimated codeword bit vector $\hat{x}$ may be calculated as shown in equation below.

(syndrome check eq.) $s=H\hat{x}^T = H(x \oplus e)^T = Hx^T \oplus He^T = He^T$     Equation 2

The result of the binary-multiplication between the parity check matrix H and the estimated codeword bit vector $\hat{x}$ may be referred to as a syndrome or a syndrome vector $s \in \mathbb{F}_2^{N-K}$. If an error is not present in the estimated codeword bit vector $\hat{x}$, e=0. The syndrome result of Equation 2 is $s=He^T=0$. Conversely, if an error is present in the estimated result $\hat{x}$ and $e \neq 0$, generally it is not satisfied that $s=He^T=0$. Depending on the configuration of the parity check matrix H, there may be e that satisfies $s=He^T=0$. However, if a code length is significantly long and the parity check matrix H is appropriately designed, there is a low probability of being $s=He^T=0$ while satisfying $e \neq 0$. Therefore, a decoder of a normal linear code may perform the operation of Equation 2 and may determine whether a codeword includes an error based on a result of the calculation, which is referred to as a syndrome check. The decoder of an LDPC code may perform, based on an estimated bit sequence, a syndrome check for each iterative decoding, so as to identify whether a decoding result is normal.

A normal process of decoding an LDPC code that is defined by the parity check matrix H will be described in detail with reference to some drawings. Decoding of an LDPC code may be understood as a so-called belief-propagation process that iteratively exchanges messages (message-passing) in a binary graph (bipartite graph) corresponding to a parity check matrix.

FIG. 3 is a diagram illustrating an embodiment of a parity check matrix of an LDPC code according to an embodiment of the disclosure.

Referring to FIG. 3, it is an example of $H \in \mathbb{F}_2^{5 \times 10}$ that is a parity check matrix of a binary LDPC code when the number of rows is N−K=5 and the number of columns is N=10. The number of '1' in the parity check matrix is referred to as a density, and the density may determine the complexity of encoding and decoding. The density of a normal parity check matrix of an LDPC code is significantly lower than the dimension of the entire parity check matrix, and this is referred to as a low-density parity check code. A parity check matrix of FIG. 3 is merely an example and a significantly low dimensional matrix is used for ease of description and thus, it should be construed that a density is relatively high. However, a high dimensional parity check matrix that is generally used may have a significantly low density.

Figure 4:
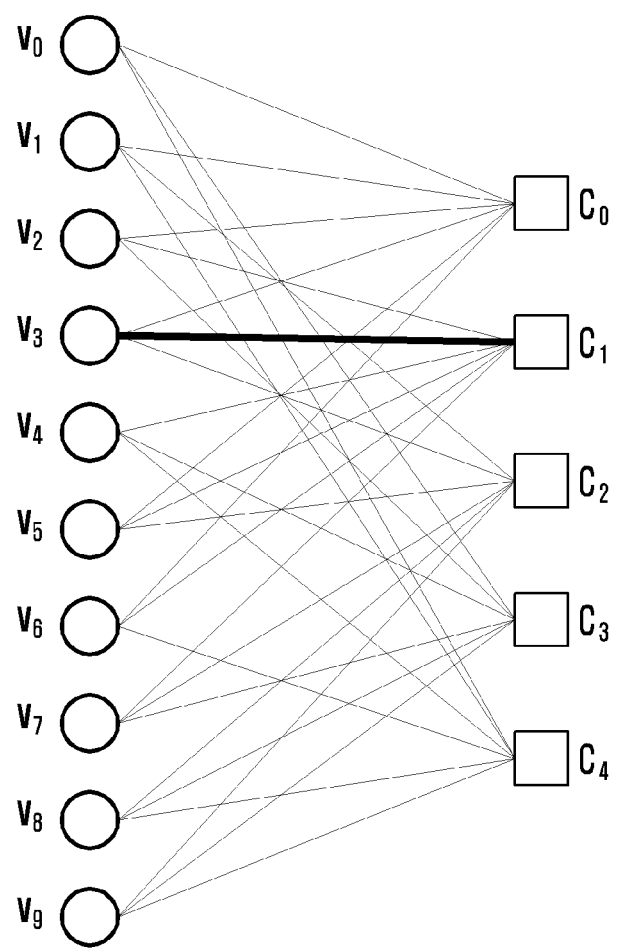
FIG. 4 is a diagram illustrating a binary graph corresponding to a parity check matrix of FIG. 3 according to an embodiment of the disclosure.

FIG. 4 is a diagram illustrating a binary graph corresponding to a parity check matrix of FIG. 3 according to an embodiment of the disclosure.

Referring to FIG. 4, a binary graph may include a variable node set $\mathcal{V}$ ($|\mathcal{V}|$=N), a check node set $\mathcal{C}$ ($|\mathcal{C}|$=N−K), and an edge set ε that connects the elements of the two sets. Variable nodes correspond to respective bits of a codeword bit vector $x \in \mathbb{F}_2^N$, and an $i^{th}$ variable node denotes a $i^{th}$ codeword bit $x_i$ having the same index. A check node is a linear equation expressed by an inner production of each row of the parity check matrix H and the binary field of a codeword bit vector x. That is, a $j^{th}$ check node may be a linear equation corresponding to $h_j x^T = \Sigma_{i=1}^N h_{ji} x_i = 0$, and this shows that the binary sum (modulo-2 sum, bitwise XOR) of bit values of all variable nodes connected to the $j^{th}$ check node in a binary graph given by H is 0. The belief-propagation decoding of an LDPC code may be understood as an iterative message exchanging process using a relationship between a variable node and a check node in the graph.

Figure 5:
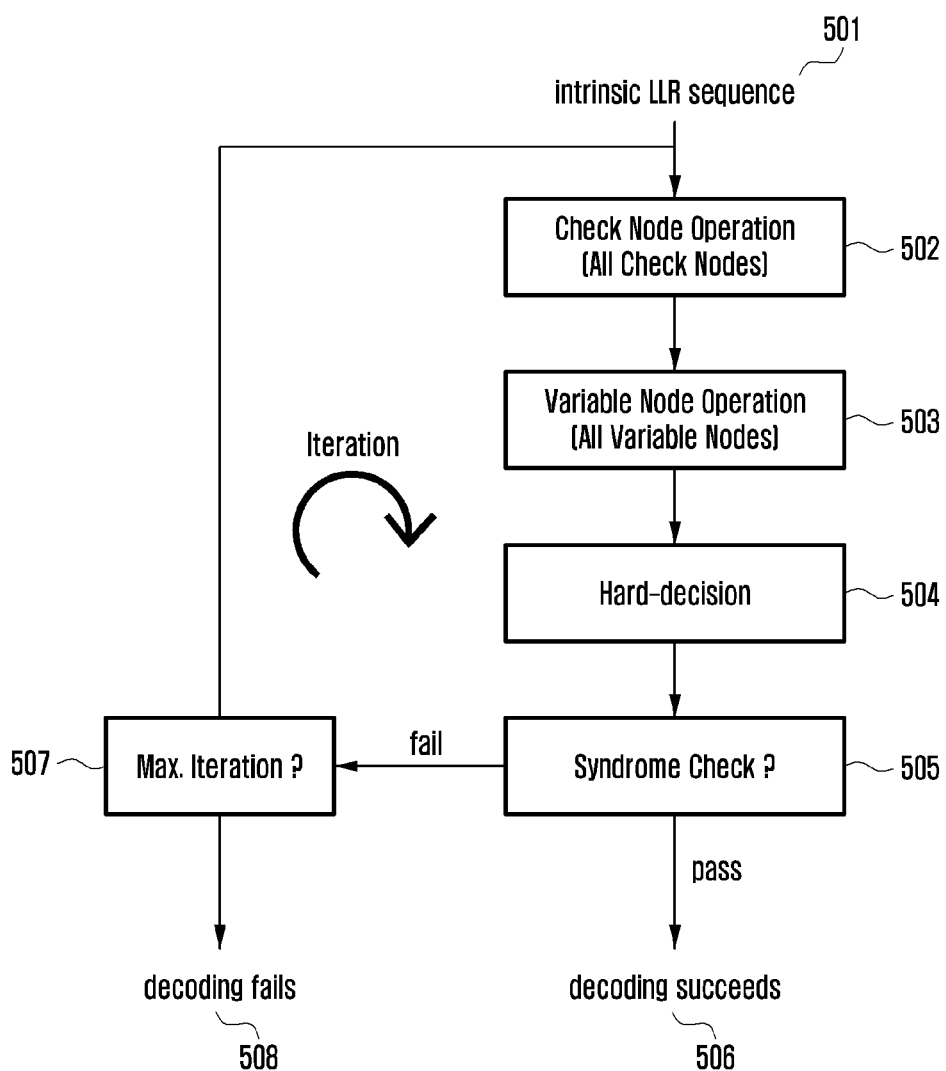
FIG. 5 is a diagram illustrating a procedure of performing flooding scheme-based decoding on an LDPC code according to the related art.

FIG. 5 is a diagram illustrating a procedure of performing a flooding scheme-based decoding on an LDPC code according to the related art.

Referring to FIG. 5, a receiver may produce an intrinsic LLR (also referred to as channel LLR) for each bit according to a series of procedures from a received signal. The process of producing an LLR from a signal may include channel estimation, multi-antenna processing, demodulation, and the like, and may be implemented in various combinations thereof. The process is beyond the scope of the disclosure and detailed description thereof will be omitted, but this is apparent that those skilled in the art will clearly understand this. An intrinsic LLR that the receiver produces for each bit may substitute for a corresponding variable node in operation 501. The LLR of each variable node in each iteration may be transferred to a neighbor check node. A check node neighboring each variable node may be a check node connected to each variable node via a connection line (edge) in a binary graph. Each check node may calculate a check-to-variable message (C2V message) corresponding to an extrinsic LLR in order to transfer a message received from a neighboring variable node again to a neighboring variable node in operation 502. A variable node neighboring to each check node may be a variable node connected to each check node via a connection line (edge) in a binary graph. A C2V message corresponding to an extrinsic LLR calculated in each check node may be transferred to a neighboring variable node via a connected edge. A variable node may produce a variable-to-check message (V2C message) to be transferred to a check node based on the extrinsic LLR and the intrinsic LLR transferred from all neighboring check nodes, and may transfer the same again to the neighboring check nodes in operation 503. In addition, each variable node produces a posteriori LLR (AP-LLR) which is an integrated LLR value for a bit value in operation 503, and may perform hard-decision based thereon so as to estimate a bit value in operation 504. The receiver may check whether the entire bit sequence estimated via the hard-decision satisfies a syndrome check of Equation 2 determined by a parity check matrix in operation 505, and if it is identified that the syndrome check is satisfied, the receiver may determine that decoding is successfully performed, and may calculate the estimate bit sequence as a final result in operation 506. If it is identified that the syndrome check is not satisfied, the receiver may identify whether the number of times that decoding is iterated up to the present reaches the predetermined maximum number of times of iterative decoding in operation 507. If the number of times that decoding is iterated up to the present does not reach the maximum number of times of iterative decoding, the receiver may repeat a series of processes starting from the operation of performing a check node operation in operation 502. In this instance, the check node may perform an operation based on a V2C message that a neighboring variable node produces. If a bit sequence estimated while decoding is iteratively performed the maximum number of times does not satisfy the syndrome check of Equation 2, the receiver may determine that decoding fails in operation 508.

The process is an embodiment of LDPC decoding, and may be corrected, modulated, and supplemented according to various schemes depending on a purpose, a situation, requirements, or the like. Although the above-described decoding process has described a flooding scheme-based LDPC decoding in which all check node finishes operations and all variable nodes performs operations, there may be, as described in the following, a layered scheme-based LDPC decoding in which some check nodes sequentially perform operations and variable nodes connected thereto may perform necessary operations. In addition, in the above-described decoding process, the syndrome check is separately performed after a check node operation, but the syndrome check may be performed together in the check node operation process. As described above, the process of decoding an LDPC code may be embodied and implemented in various schemes, and the schemes do not limit the application or effect of the disclosure. In addition, schemes that are not mentioned may be also clearly understood by those skilled in the art.

In the above-described conventional belief-propagation decoding process that decodes an LDPC code, a process in which each variable node and a check node calculate a message will be briefly described as follows. For clear description, the following symbols will be used.

$I_{max}$: the maximum number of times that iterative LDPC decoding is performed.

$x=(x_1, x_2, \ldots, x_N)$: a codeword bit vector (bit $x_i$ corresponds to variable node $v_i$)

$\mathcal{V} = \{v_1, v_2, \ldots, v_N\}$: a set of all variable nodes ($|\mathcal{V}|$=N)

$\mathcal{C} = \{c_1, c_2, \ldots, c_{N-K}\}$: a set of all check nodes ($|\mathcal{C}|$=N−K)

$\mathcal{V}_j$: a set of variable nodes connected to check node $c_j$ ($\mathcal{V}_j \subset \mathcal{V}$)

$\langle \mathcal{V}_j \rangle$: indices of element variable nodes of set $\mathcal{V}_j$ (e.g., if $\mathcal{V}_j = \{v_0, v_1, v_5\}$, $\langle \mathcal{V}_j \rangle = \{0, 1, 5\}$)

$\mathcal{C}_i$: a set of check nodes connected to variable node $v_i$ ($\mathcal{C}_i \subset \mathcal{C}$)

$\langle \mathcal{C}_i \rangle$: indices of element check nodes of set $\mathcal{C}_i$ (e.g., is $\mathcal{C}_i = \{c_0, c_2, c_6\}$, $\langle \mathcal{C}_i \rangle = \{0, 2, 6\}$)

$\lambda_i$: intrinsic LLR of a bit corresponding to variable node $v_i$ $\gamma_i$: a posteriori LLR of a bit corresponding to variable node $v_i$ $\alpha_{i \to j}$: a variable-to-check message that variable node $v_i$ transfers to check node $c_j$ $\beta_{j \to i}$: check-to-variable message that check node $c_j$ transfers to variable node $v_i$ $\hat{x}_i$: estimated value of codeword bit $x_i$ corresponding to variable node $v_i$ $s_j$: syndrome calculated by check node $c_j$ An embodiment of a belief-propagation decoding process on an LDPC code using the symbols may be expressed as pseudocode below. A mathematical symbol used in the pseudocode may follow a general example. If two sets $\mathcal{A}$ and $\mathcal{B}$ are given, $\mathcal{A}\backslash\mathcal{B}$ denotes a relative complement (or a set difference) of set $\mathcal{A}$ in association with set $\mathcal{A}$.

```
Input: Λ = (λ₁, . . . , λ_N)
Output: x̂ = (x̂₁, . . . , x̂_K) and decoding report
    1:  α_{i→j} ← λ_i for i ∈ {1, . . . , N} and j ∈ C_i
    2:  for ℓ = 1, . . . , I_max do
    3:      for j = 1, 2, . . . , N − K do
    4:          β_{j→i} ← f ({α_{k→j}}_{k∈V_j\{i}})
    5:      end for
    6:      for i = 1, 2, . . . , N do
    7:          α_{i→j} ← λ_i + Σ_{k∈(C_i)\{j}} β_{k→i}
    8:          γ_i ← λ_i + Σ_{k∈(C_i)} β_{k→i}
    9:      end for
    10:     x̂_i ← { 0, if γ_i ≥ 0,
                    1, otherwise    · for i ∈ {1, 2, . . . , N}
    11:     s_j ← (Σ_{i∈V_j} x̂_i) mod 2 for j ∈ {1, 2, . . . , N − K}
    12:     if s_j = 0 for all j ∈ {1, 2, . . . , N − K} then
    13:         report decoding success; return x̂ = (x̂₁, . . . , x̂_K)
    14:     end if
    15: end for
    16: report decoding failure; return dummy x̂ = (x̂₁, . . . , x̂_K)
```

An iterative belief-propagation decoding process on an LDPC code will be described using the symbol and the pseudocode. An intrinsic LLR input earlier may substitute for a V2C message that each variable node transfers to a neighboring check node (pseudocode Line 1). That is, the initial value of the V2C message that a variable node $v_i$ transfers to a neighboring check node $c_j \in C_i$ may be determined as $\lambda_i$ that is the intrinsic LLR of the corresponding variable node. Belief-propagation decoding may be performed by a predetermined number of times $I_{max}$ (pseudocode Line 2-15). Each check node may calculate, using a message transferred from a neighboring variable node, a message to be transferred again to the neighboring variable node (pseudocode Line 3-5). A message $\beta_{j\to i}$ that the check node $c_j$ transfers to the neighboring variable node $v_i \in V_j$ may be calculated as given in Equation 3.

$$\beta_{j\to i} = f(\{\alpha_{k\to j}\}_{k\in V_j\setminus\{i\}}) = 2\tanh^{-1}\left(\prod_{k\in V_j\setminus\{i\}} \tanh\left(\frac{\alpha_{k\to j}}{2}\right)\right) \quad \text{Equation 3}$$

A physical meaning of the message produced based on Equation 3 is an extrinsic LLR associated with the bit value of a variable node $v_i$ calculated based on a linear relation that a check node $c_j$ has. The check node message operation expression of Equation 3 may need to perform significantly complex tan h(•), and multiplexing values may be more complicated than adding values. Accordingly, depending on the situation or requirements, Equation 3 needs to be made a low complex operation model or approximated to be a low complex operation. Representatively, a method of applying log(tan h(•)) to messages corresponding to an LLR, and transferring the message to a log domain so as to change a multiplying operation into an add operation, a method of calculating each unit operation using a look-up table that a processor is capable of easily processing, and the like may be used. In addition, min-sum based scheme may be used that approximates the process of Equation 3 as shown in Equation 4, by accepting a slight loss in performance.

$$\beta_{j\to i} = f(\{\alpha_{k\to j}\}_{k\in V_j\setminus\{i\}}) = (\prod_{k\in V_j\setminus\{i\}} \text{sgn}(\alpha_{k\to j})) \cdot \min_{k\in V_j\setminus\{i\}} |\alpha_{k\to j}| \quad \text{Equation 4}$$

In Equation 4, a correction process such as normalization or offset may be performed in order to increase performance. A C2V message operation processes such as Equation 3 and Equation 4 may be designed not to redundantly perform the same operation. Representatively, a message operation scheduling method which is called a forward-backward operation or the like may be used.

A variable node may calculate a C2V message based on an intrinsic LLR value and a message received from neighboring check nodes, and may transfer the same to a neighboring check node (pseudocode Line 7). A message that the variable node $v_i$ transfers to the neighboring check node $c_j \in C_i$ may be calculated as shown in Equation 5 below.

$$\alpha_{i\to j} = \lambda_i + \sum_{k\in\{C_i\}\setminus\{j\}} \beta_{k\to i} \quad \text{Equation 5}$$

According to Equation 5, the variable node $v_i$ may add an intrinsic LLR value and a C2V message for an extrinsic LLR received from all other neighboring check nodes excluding the check node $c_j$, and may transfer the same to the check node $c_j$. As described above, at the initial iterative decoding, a message transferred from a check node to a variable node is not present, and thus, the value of a C2V message for an extrinsic LLR received from a neighboring check node is regarded as 0 and the intrinsic LLR value of each variable node may be transferred to neighboring check nodes as a V2C message. In addition, the variable node may calculate an AP-LLR in order to estimate a bit value (pseudocode Line 8). Provided that the AR-LLR of a variable node $v_i$ is $\gamma_i$, Equation 6 below may be calculated as follows.

$$\gamma_i = \lambda_i + \sum_{k\in\{C_i\}} \beta_{k\to i} \quad \text{Equation 6}$$

A V2C message production equation of Equation 5 associated with variable node $v_i$ may be significantly similar to an AR-LLR value calculation formula of Equation 6. For example, a V2C message and an AR-LLR are in the relationship of $\alpha_{i\to j} = \gamma_i - \beta_{j\to i}$, and thus, an efficient scheme to reduce a redundant operation may be designed and used to actually implement a decoder.

The receiver may perform hard decision based on an AP-LLR value calculated based on Equation 6, and may estimate a bit value corresponding to each variable node (pseudocode Line 10). In the disclosure, descriptions will be provided given that an LLR value has a high positive value when a probability of a bit value of 0 is high, and an LLR value has a high negative value when a probability of a bit value of 1 is high. However, even though the definition is opposite (i.e., an LLR value has a high positive value when a probability of a bit value of 1 is high, and an LLR value has a high negative value when a probability of a bit of 0 is high), if a receiver operation is designed based thereon, fundamental operation and performance may not be different. According to the hard decision rule, an estimated value $\hat{x}_i$ of an $i^{th}$ codeword bit may be determined based on Equation 7.

$$\hat{x}_i = \begin{cases} 0, & \text{if } \gamma_i \geq 0 \text{ (or } \gamma_i > 0) \\ 1, & \text{otherwise} \end{cases} \quad \text{Equation 7}$$

As illustrated in FIG. 5, in the conventional decoding process, hard decision may be performed on all codeword bits, that is, bit (variable node) indices i=1, 2, . . . , N.

If an estimated codeword bit vector $x=(x_1, x_2, \ldots, x_N)$ is given via the hard decision, a receiver may perform a syndrome check based on $s=H\hat{x}^T$ that is the syndrome check of Equation 2 (pseudocode Line 11). The receiver may efficiently perform a syndrome check using a binary graph, rather than merely calculating the syndrome check of Equation 2 as it is. For example, the result of $s_j=h_j\hat{x}^T$ that is a $j^{th}$ ($j \in \{1, 2, \ldots, N-K\}$) syndrome value may be the same as the result obtained by performing a binary sum (modulo-2 sum, XOR) on estimated bit values of all variable nodes connected to a $j^{th}$ check node in a graph. Therefore, the $j^{th}$ syndrome may be calculated as shown in Equation 8 below.

$$s_j = h_j \hat{x}^T = \sum i \in (\mathcal{V}_j) \hat{x}_i \quad \text{Equation 8}$$

Addition performed in Equation 8 is a binary sum. Syndrome calculation according to Equation 8 may be understood as a process in which each variable node transfers an estimated bit value to a neighboring check node, and each check node calculates a binary sum of all received estimated bit values. In the conventional decoding process, a syndrome may be calculated on all check nodes, that is, check node indices j=1, 2, . . . , N–K.

While syndrome calculation is performed or after syndrome calculation is performed, a process of checking whether any one of the calculated syndrome values is 0 is referred to as a syndrome check (pseudocode Line 12-14). If a calculated syndrome vector $s=(s_1, s_2, \ldots, s_{N-K})$ is a zero-vector having a length of N–K, a decoder may provisionally determine that decoding is successfully performed and may proceed with a subsequent procedure. The subsequent procedure after the provisional decoding success may include early termination of iterative decoding, decoding of outer coding such as a CRC code, and the like. Conversely, if a calculated syndrome vector s is not a zero vector, that is, if the elements of the syndrome vector s include at least one 1, the decoder may provisionally determine that decoding fails, and may proceed with a subsequent procedure. The subsequent procedure after the provisional decoding failure may include continuously performing subsequent iterative belief-propagation decoding, or reporting a final decoding failure when the number of times of iterative decoding exceeds the predetermined maximum number $I_{max}$, or the like. The syndrome check process may be implemented in various schemes. For example, all syndromes may be calculated, and whether all the syndrome values are 0 is checked. As another example, syndrome calculation is performed one by one or based on a predetermined group, and if any one of the calculated syndrome values is not 0, the syndrome calculation and check process is immediately terminated and a subsequent process associated with a decoding failure will be performed.

The syndrome check process may be similar to a check node operation process from the perspective that a variable node transfers a message which is an estimated bit value to a neighboring check node and the check node performs an operation based on the received value. For the reason, a check node operation and a syndrome check may be implemented together. There are various methods for effectively scheduling and performing a check node operation and a syndrome check process. In the disclosure, although the schemes are not described, those skilled in the art may clearly understood the schemes.

Hereinafter, for a quasi-cycle (QC) LDPC code of the 3GPP 5G NR, ATSC 3.0 system or the like, a method of performing efficient decoding based on the characteristic of a parity check matrix will be described. A QC-LDPC code is one of the subclasses of an LDPC code, and is a code that constructs a graph associated with a final parity check matrix via lifting that is an extending and constructing operation based on a small graph called a protograph. The lifting process is a permute process that copies Z small photographs, and rearranges the disposition of edges of the graph according to a determined rule. Z denotes a lifting size. The QC structure is widely used since the QC structure is easily implement a decoder of an LDPC code corresponding thereto to achieve a high throughput. However, the scope of the embodiments of the disclosure is not limited to an LDPC code having a QC structure.

Among the QC-LDPC codes, a QC-LDPC code used in 3GPP 5G NR, ATSC 3.0, and the like may have a structure that performs 2-step encoding, that is, a precoder and single parity check (SPC) extension, or a QC-LDPC code structure equivalent thereto. $x \in \mathbb{F}_2^{1 \times N}$ that is a codeword bit vector of the QC-LDPC code configured by 2-step encoding may be constructed via concatenation of three subvectors m, $p_1$, and $p_2$ as given in Equation 9 below.

$$x = [m p_1 p_2] \quad \text{Equation 9}$$

The vector $m \in \mathbb{F}_2^K$ is an input information bit vector to be encoded, and may include a shortening bit of which the value is fixed and is not transmitted. The value of the shortening bit is fixed to 0 but it not be always limited to 0. A bit vector $p_1$ is a first parity bit vector produced by a precoder, and each parity bit of $p_1$ is determined based on a linear combination of other bits in $p_1$ and an input information bit vector m. A bit vector $p_2$ is a second parity bit vector produced by SPC extension, and each bit of $p_2$ may be determined by linear combination between bits of a first parity bit vector $p_1$ and input information bit vector m. According to the characteristic of SPC extension, other bits of $p_2$ may not affect production of each bit of a second parity bit vector $p_2$.

The characteristic of a QC-LDPC code that produces a codeword according to the 2-step encoding may be shown through a parity check matrix H.

FIGS. 6A to 6F are diagrams illustrating a parity check matrix 600 of a QC-LDPC code used in a 3GPP NR as an example of the above-described parity check matrix according to various embodiments of the disclosure.

Figure 6A:
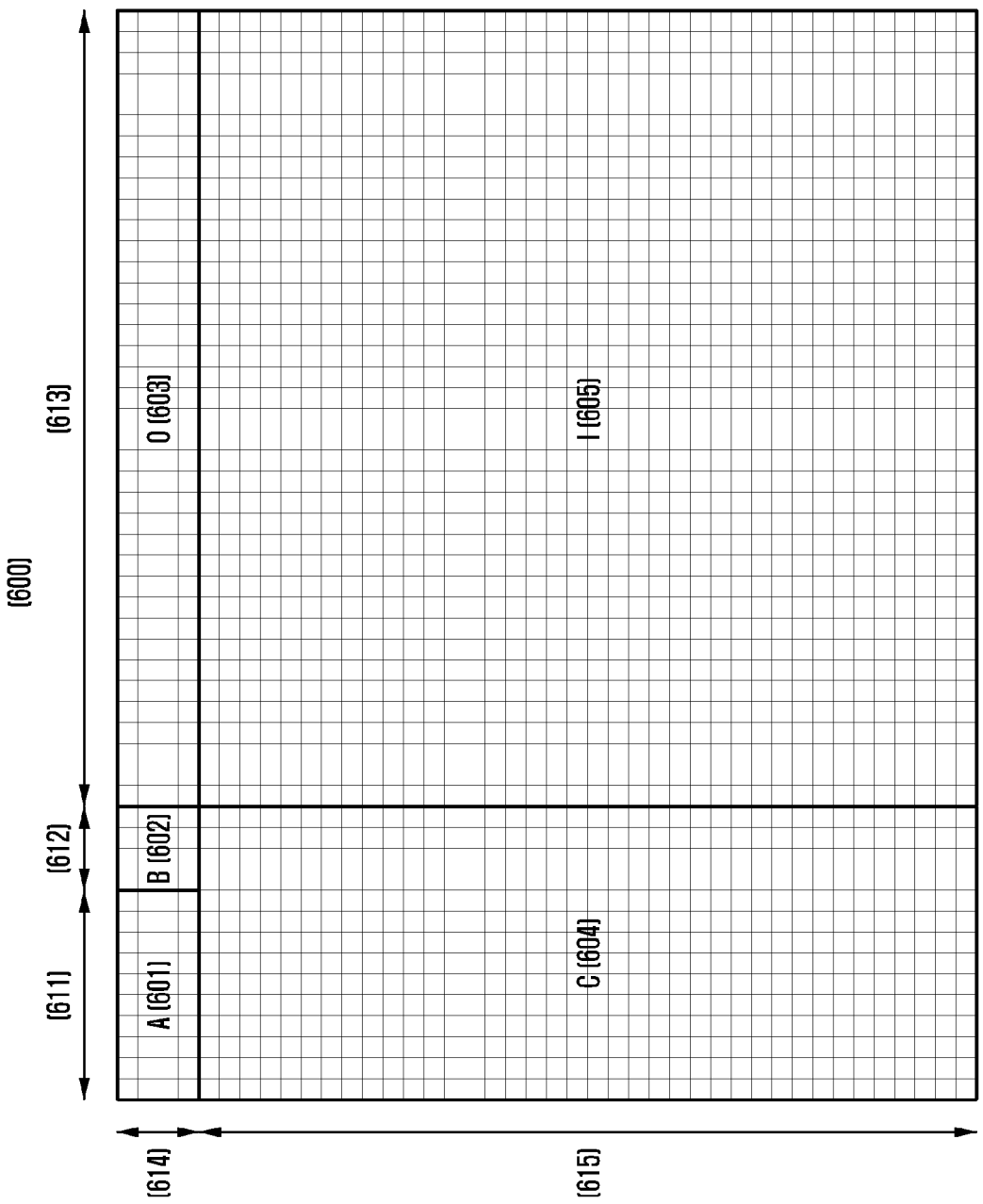
FIG. 6A is a diagram illustrating an example of a parity check matrix of an LDPC code configured based on two steps including precoding and single parity-check extension according to an embodiment of the disclosure.
Figure 6C:
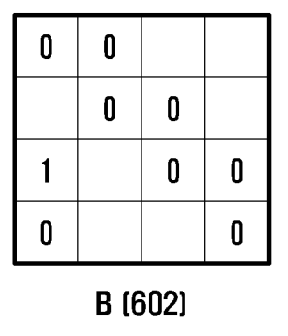
Figure 6D:
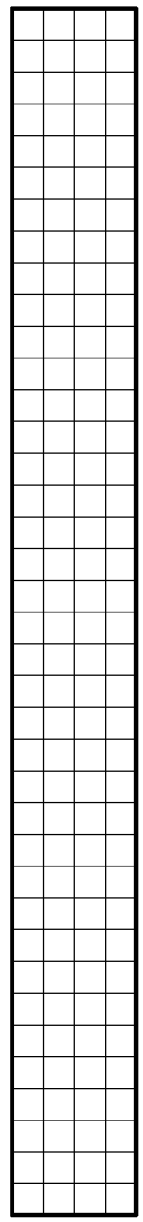
FIG. 6D is diagram illustrating an example of a submatrix included in a parity check matrix according to an embodiment of the disclosure.
Figure 6F:
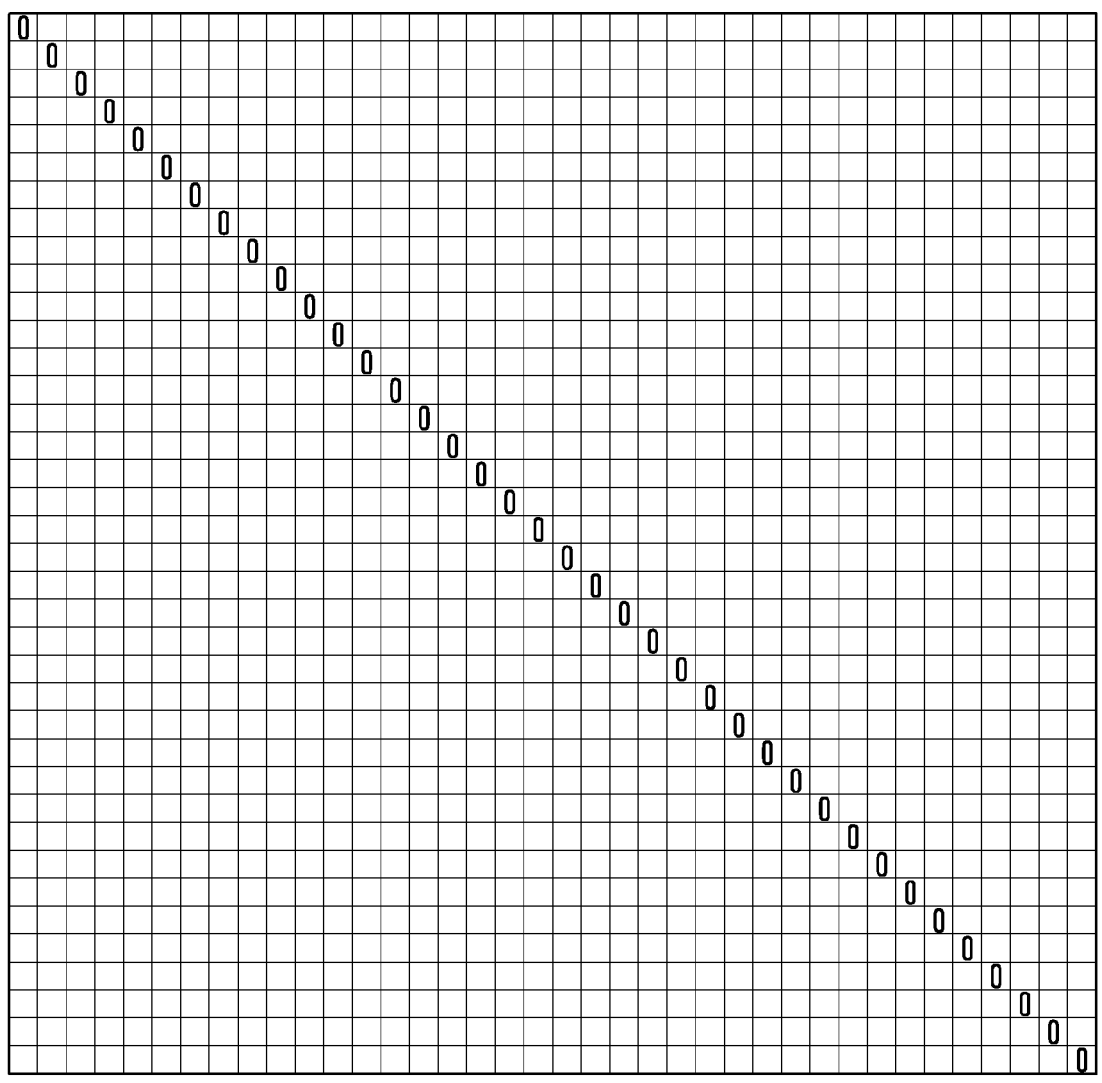
FIG. 6F is diagram illustrating an example of a submatrix included in a parity check matrix according to an embodiment of the disclosure.

Referring to FIG. 6A. the configuration of a parity check matrix H for a QC LDPC code may be expressed as the concatenation of 5 submatrices A 601, B 602, 0 603, C 604, and I 605, as shown in Equation 10 below.

$$H = \begin{bmatrix} A & B & 0 \\ C & & I \end{bmatrix} \quad \text{Equation 10}$$

In a matrix of FIGS. 6A to 6F, each element or entity provided in a unit square may be a Z×Z matrix.

Referring to FIGS. 6B to 6F, they illustrate examples of a submatrix included in a parity check matrix according to an embodiment of the disclosure, and a unit square marked with a predetermined value in the submatrix is a Z×Z circulant permutation matrix obtained by cyclic shifting (normally to the right) a Z×Z identity matrix (identity matrix) by the corresponding value. For example, a unit square marked with 0 in FIGS. 6B to 6F may be a Z×Z identity matrix to which cyclic shift is not performed. Conversely, a unit square to which no value is written may be a Z×Z zero matrix. The parity check matrix H of the QC-LDPC code may be defined by identifying where an entity different from 0 needs to be disposed, and identifying the value of an entity different from 0.

The submatrices A, B, and C in Equation 10 are matrices that are normally carefully designed matrices. Normally A and C are freely designed areas, and B is designed to have a structure having a predetermined rule to substantially reduce the complexity of encoding of a precoder. 0 is a zero matrix in which all element values are 0, and I is an identity matrix in which diagonal element values are all 1 and the remaining element values are 0.

Referring to FIG. 6A, a part 614 including submatrices A 601 and B 602 is a parity check matrix of a precoder, and a part 615 including submatrices C 604 and I 605 is a parity check matrix of an SPC extension. As described above, a column in the parity check matrix H corresponds to a codeword bit vector $x=(x_1, x_2, \ldots, x_N)$ and an ith column one-to-one corresponds to an ith variable node (=ith codeword bit $x_i$) of a binary graph. In the case of a systematic LDPC code used in 3GPP NR and ATSC 3.0, variable nodes corresponding to a column 611 of the submatrix A 601 in the parity check matrix of FIG. 6A may correspond to information bit vector m that is an input to be encoded. Variable nodes corresponding to a column 612 of the submatrix B 602 may correspond to a first parity bit vector $p_1$ produced by a precoder. Variable nodes corresponding to the column 613 of the submatrix 0 603 or I 605 may correspond to a vector $p_2$ of a second parity bit produced by SPC extension.

Variable nodes corresponding to the second parity bit vector $p_2$ produced by the SPC extension may have only a single element that is different from 0 in the corresponding column, and this is expressed that a degree is 1. Conversely, the degree of a variable node of a bit corresponding to the first parity bit vector $p_1$ and information bit vector m may be greater than 1. Generally, the absolute value of an AP-LLR that a variable node operates, that is, reliability, may be determined based on the degree of the corresponding variable node as shown in Equation 6, that is, based on from how many check nodes messages are received. Therefore, generally, the reliability of each bit estimated according to the result of iterative belief-propagation decoding may be increased when the degree is high, may be decreased the degree is low. From the perspective of view, if each bit of the second parity bit vector $p_2$ having a degree of 1 performs iterative belief-propagation decoding, the reliability thereof is not increased, but the reliability of other connected (important) bits, for example, information bits or the reliability of the first parity bit may be increased and thus, decoding is successfully performed. The objective of the receiver and the decoder is to finally and accurately estimate a bit belonging to an information bit vector, and an LDPC code having the above-described structure may be useful to achieve the objective based on the fact that parity bits are not necessarily accurately estimated.

According to an embodiment, a variable node operation is not performed on a codeword bit that is expected to have low reliability. Hereinafter, a set of indices of low-reliable codeword bits that are expected to have low reliability is expressed as $\bar{\mathcal{P}} \subset \{1, 2, \ldots, N\}$. Otherwise, a set of indices of high-reliable codeword bits that are expected to have high reliability is expressed as $\mathcal{P} = \{1, 2, \ldots, N\} \setminus \bar{\mathcal{P}}$. It should be construed that the expression 'reliability' is not directly related to the reliability of an actual bit, but to describe characteristics briefly. $\mathcal{P}$ and $\bar{\mathcal{P}}$ are disjoint sets as indicated by mathematical symbols, which are $\mathcal{P} \cap \bar{\mathcal{P}} = \emptyset$ and $\mathcal{P} \cup \bar{\mathcal{P}} = \{1, 2, \ldots, N\}$. According to an embodiment of the disclosure, $\bar{\mathcal{P}}$ may include all or some of indices of bits included in the second parity bit vector $p_2$ produced by SPC extension. In addition, indices of some of the codeword bits included in the first parity bit vector $p_1$ or information bit vector m may be included in $\bar{\mathcal{P}}$. As described above, if $\bar{\mathcal{P}}$ is determined, $\mathcal{P}$ is determined to be $\mathcal{P} = \{1, 2, \ldots, N\} \setminus \bar{\mathcal{P}}$. According to another embodiment, a codeword bit index set $\mathcal{P}$ that is expected to have high reliability may be determined. Accordingly, $\bar{\mathcal{P}}$ may be determined to be $\bar{\mathcal{P}} = \{1, 2, \ldots, N\} \setminus \mathcal{P}$.

In addition, according to an embodiment of the disclosure, a set of check nodes to which any one of the codeword bits considered to have low reliability is connected is distinguished from others. In the check node universal set $\{c_1, c_2, \ldots, c_{N-K}\}$, if the index of any one of the neighboring variable nodes belongs to $\bar{\mathcal{P}}$, a subset of the check nodes denotes $\bar{\mathcal{S}}$. A set of the remaining indices corresponding to the set difference denotes $\mathcal{S} = \{1, 2, \ldots, N-K\} \setminus \bar{\mathcal{S}}$.

As described above, disjoint sets $\mathcal{P}$ and $\bar{\mathcal{P}}$ are determined, the decoder of an LDPC code according to an embodiment of the disclosure may perform different variable node operations with respect to variable nodes having indices belonging to two sets. The decoder may calculate a V2C message and an AP-LLR as shown in Equation 5 and Equation 6 with respect to a variable node having an index belonging to an index set $\mathcal{P}$ of a codeword bit expected to have high reliability. Conversely, the decoder may omit or simplify an operation with respect to a variable node having an index belonging to an index set $\bar{\mathcal{P}}$ of a codeword bit expected to have low reliability. Particularly, with respect to a variable node having an index belonging to $\bar{\mathcal{P}}$, the decoder embodied according to an embodiment of the disclosure may not perform some or all of a series of operations including AP-LLR calculation, hard-decision based on an AP-LLR, a syndrome-check related to an estimated value of a bit obtained via the hard decision. For example, any operation is not performed with respect to a variable node having an index belonging to a set $\bar{\mathcal{P}}$, and a V2C message and an AP-LLR are maintained when the intrinsic LLR is initially set. Particularly, an AP-LLR may not be calculated and stored separately. In addition, the AP-LLR is not calculated and stored, hard decision based thereon is not performed. In addition, a codeword bit is not estimated and thus, a syndrome that the bit is associated with, that is, with respect to a check node having an index belonging to $\bar{\mathcal{S}}$, syndrome calculation is not performed. Even though syndrome calculation is performed in any way, that may be disregarded when determining whether decoding is successfully performed or fails.

Figure 7:
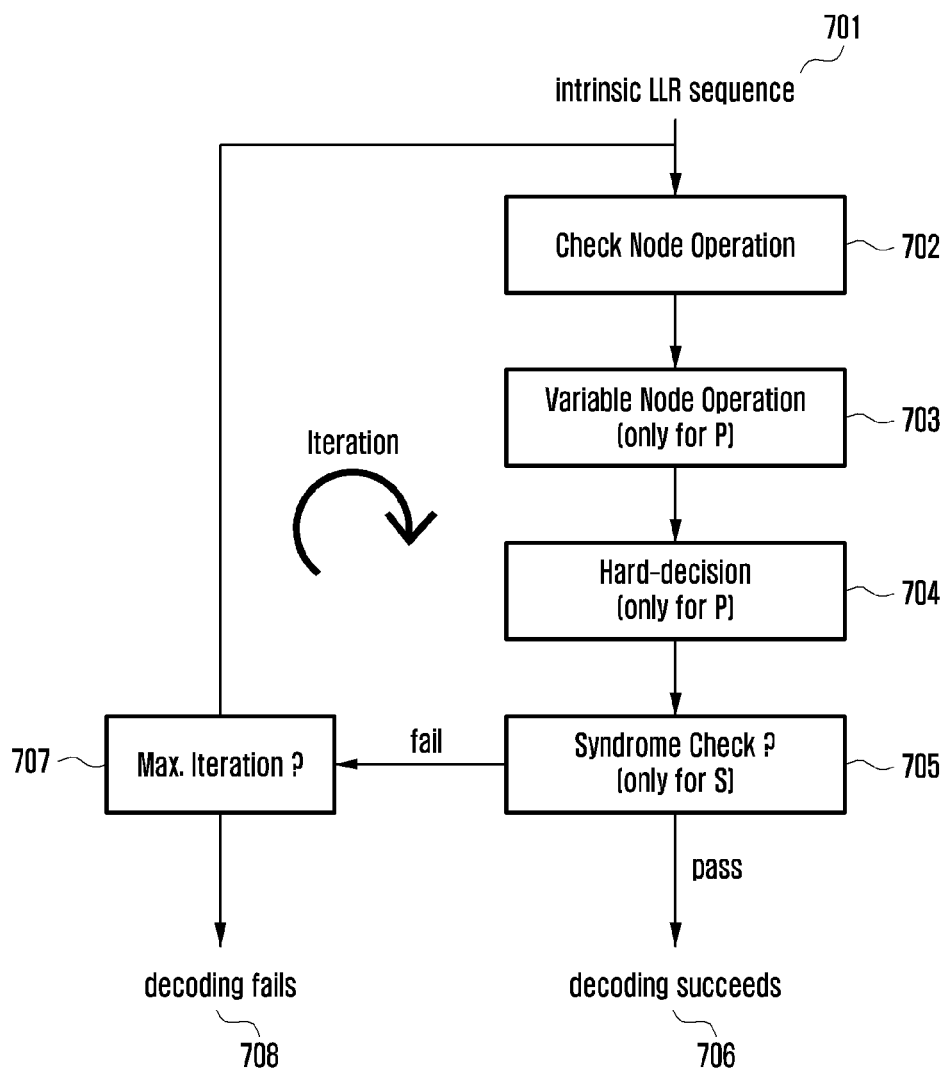
FIG. 7 is a diagram illustrating a simplified procedure of flooding scheme-based decoding on an LDPC code according to an embodiment of the disclosure.

FIG. 7 is a diagram illustrating a flooding scheme-based decoding on an LDPC code according to an embodiment of the disclosure.

Referring to FIG. 7, operations 701 and 702 are similar to operations 501 and 502 respectively. A decoding operation or decoding apparatus according to an embodiment of the disclosure may perform a variable node operation 703 and hard decision 704 on only a codeword bit (of which the index belongs to set $\mathcal{P}$) expected to have high reliability. In addition, according to an embodiment of the disclosure, a decoding operation or decoding apparatus may perform a syndrome check on only a check node (of which the index belongs to $\mathcal{S}$) connected to only codeword bits expected to have high reliability, and may determine whether decoding is successfully performed/fails based thereon in operation 705.

An LDPC decoding apparatus and a reception device configured as hardware such as FPGA, ASIC, SoC, or the like according to an embodiment of the disclosure may not include all or some of a processing unit and a storage, such as a processor for AP-LLR calculation and hard decision value in association with codeword bits corresponding to some or all indices belonging to set $\bar{\mathcal{P}}$, a memory, or the like. In addition, depending on the configuration of the decoder, all or some of a processing unit and a storage may not be included, such as a processor that performs a syndrome check related to an estimated value of a codeword bit corresponding to an index that belongs to set $\bar{\mathcal{P}}$, a memory, or the like. Operations 706, 707 and 708 are similar to operations 506, 507 and 508 respectively.

Figure 8:
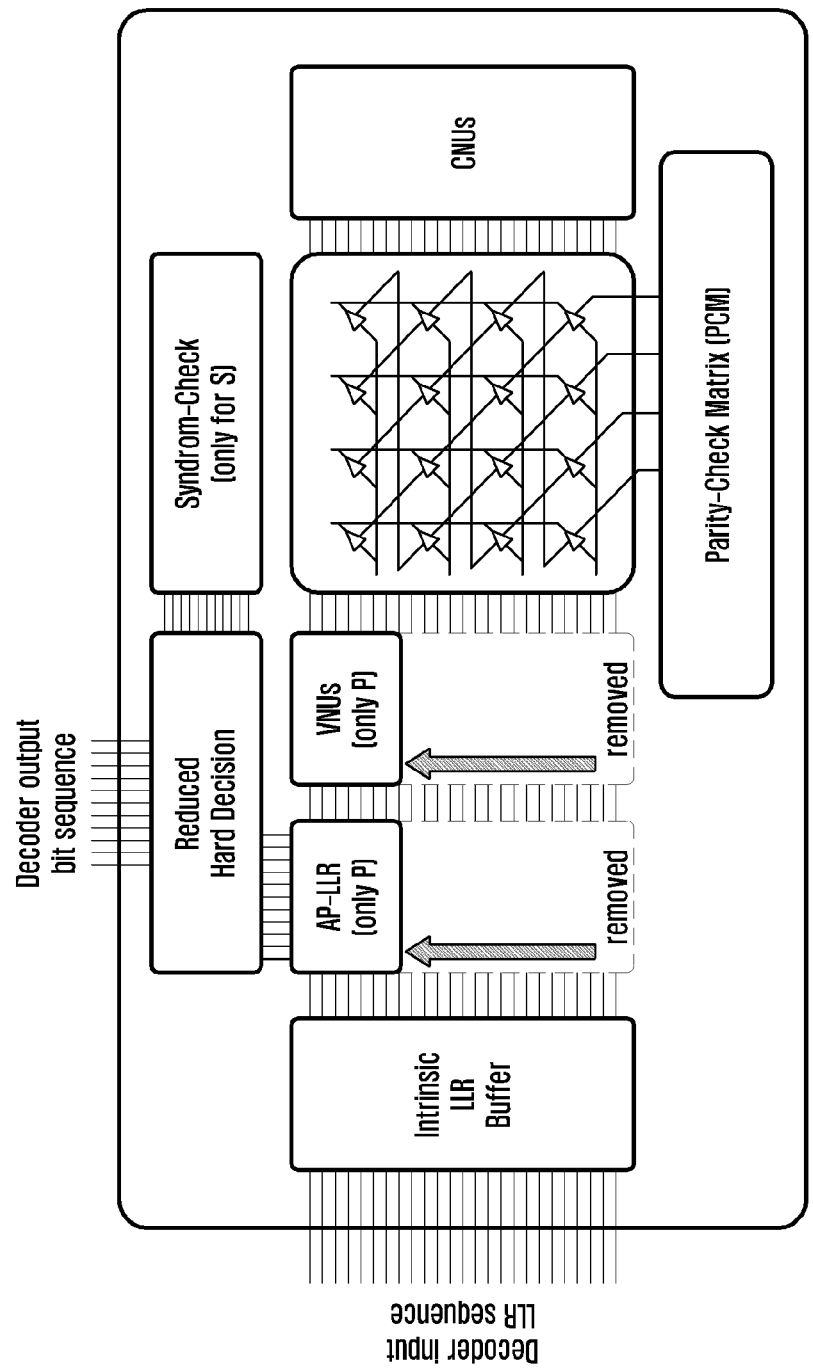
FIG. 8 is a diagram illustrating an example of a simplified architecture of a decoder of a LDPC code configured according to an embodiment of the disclosure.

FIG. 8 illustrates an LDPC decoding apparatus configured according to an embodiment of the disclosure.

Referring to FIG. 8, an LDPC decoding apparatus (or decoder) according to an embodiment of the disclosure may configure a processor for performing a variable node operation on only a predetermined variable node (of which the index belongs to set $\mathcal{P}$), and a storage memory. Through the above, the amount of consumption of the processor and the memory of a hardware device may be achieved without a loss of error-correction capability.

According to an embodiment of the disclosure, although here are described LDPC codes having various lengths and various code rates configured based on two types of photographs (base graph), that is, Base Graph 1 (BG1) and Base Graph 2 (BG2), in consideration of the 3GPP NR system, the disclosure is not limited thereto. Base Graph 1 and Base Graph 2 may be a Base Graph defined in the 5G NR standard, for example, TS 38.212 or the like. The following pseudocode is an embodiment when the disclosure is applied to decoding of an LDPC code of the 3GPP NR system.

---

Input: $\Lambda = (\lambda_1, \ldots, \lambda_N)$
Output: $\hat{x} = (\hat{x}_1, \ldots, \hat{x}_K)$ and decoding report
  1: $\alpha_{i \to j} \leftarrow \lambda_i$ for $i \in \{1, \ldots, N\}$ and $j \in \langle \mathcal{C}_i \rangle$
  2: for $\ell = 1, \ldots, I_{max}$ do
  3:   for $j = 1, 2, \ldots, N - K$ do
  4:     $\beta_{j \to i} \leftarrow f(\{\alpha_{k \to j}\}_{k \in \mathcal{V}_j \setminus \{i\}})$
  5:   end for
  6:   for $i = 1, 2, \ldots, K + 4Z$ do
  7:     $\alpha_{i \to j} \leftarrow \lambda_i + \sum_{k \in \mathcal{C}_i \setminus \{j\}} \beta_{k \to i}$
  8:     $\gamma_i \leftarrow \lambda_i + \sum_{k \in \mathcal{C}_i} \beta_{k \to i}$
  9:   end for
10:     $\hat{x}_i \leftarrow \begin{cases} 0, & \text{if } \gamma_i \geq 0, \\ 1, & \text{otherwise} \end{cases}$ for $i \in \{1, 2, \ldots, K + 4Z\}$ 11:   $s_j \leftarrow (\sum_{i \in \mathcal{V}_j} \hat{x}_i) \bmod 2$ for $j \in \{1, 2, \ldots, 4Z\}$
12:   if $s_j = 0$ for all $j \in \{1, 2, \ldots, 4Z\}$ then
13:     report decoding success; return $\hat{x} = (\hat{x}_1, \ldots, \hat{x}_K)$
14:   end if
15: end for
16: report decoding failure; return dummy $\hat{x} = (\hat{x}_1, \ldots, \hat{x}_K)$

---

A process of applying the disclosure to an LDPC code configured based on BG1 among 3GPP NR LDPC codes will be described. In the case of an LDPC code configured based on BG1, the length of information bit vector m may be K=22Z. Z is determined based on various code parameters (code dimension, code length, code rate, or the like) given as a lifting size. In the information bit vector m, a value is fixed and a shorten bit that a transmitter and a receiver are mutually aware of may be included in. The transmitter may produce a first parity bit vector $p_1$ having a length of 4Z using a precoder, and may produce a second parity bit vector $p_2$ having a length of 42Z using SPC extension. In the case of an LDPC code configured based on BG1, the transmitter may produce a codeword bit vector $x = [m \; p_1 \; p_2]$ having a total length of 68Z, as shown in Equation 9. The transmitter may perform puncturing of a part of a codeword bit vector based on a given coding rate or the like, and may transmit the rest. For example, the 3GPP NR system may puncture first 2Z bits of a codeword bit vector x and may not transmit the same.

When the receiver performs decoding according to an embodiment of the disclosure, some or all of the operations associated with a variable node corresponding to the second parity bit vector $p_2$ may not be performed. The operations that do not performed in association with the variable node may be V2C message calculation, AP-LLR calculation, hard-decision, a related syndrome operation, and the like. Therefore, conventionally, the number of operations required for a total of 68Z variable nodes may be reduced to 26Z by excluding 42Z variable nodes corresponding to the size of $p_2$. In an LDPC decoding apparatus embodied as a hardware such as FPGA, ASIC, SoC, or the like, variable node units (VNUs) and an AP-LLR memory buffer may be decreased by approximately 61.76%. In addition, according to an embodiment of the disclosure, the number of arithmetic operations that an LDPC decoder performs may be decreased.

Figure 9:
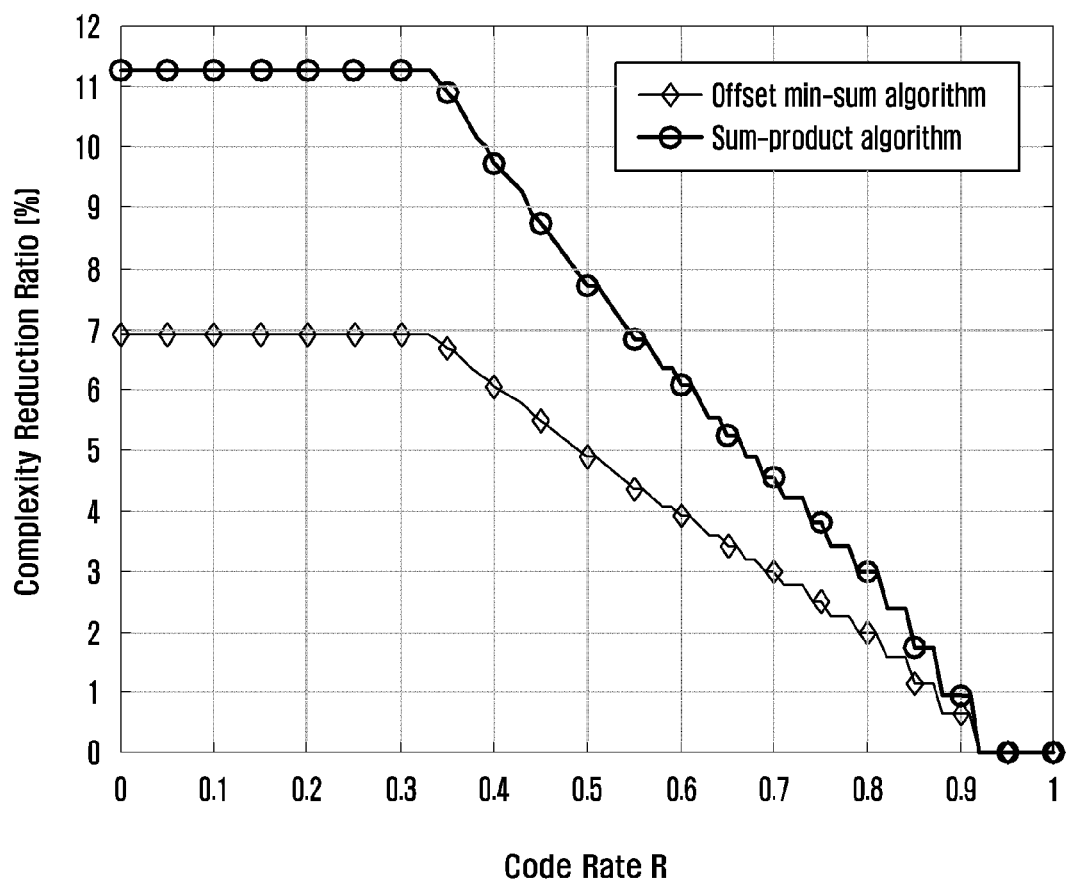
FIG. 9 is a diagram illustrating a rate of decrease in an amount of operation with variation of code rate when an embodiment of the disclosure is applied to decoding of an LDPC code configured based on base graph 1 in a 3GPP NR standard system according to an embodiment of the disclosure.

FIG. 9 is a diagram illustrating the rate of decrease in the amount of arithmetic operation according to a code rate transmitted in a 3GPP NR LDPC code system configured based on BG1, when compared to the conventional method according to an embodiment of the disclosure. A sum-product algorithm that performs an operation such as Equation 3 and a min-sum algorithm (applying offset) that performs an operation such as Equation 4 are taken into consideration.

Referring to FIG. 9, the number of arithmetic operations may be decreased by at the maximum of 7% to 11.2%, depending on an algorithm. A syndrome check is performed only on a precoder which a second parity bit vector $p_2$ via SPC extension does not take part in, so that the number of times of operations may be reduced. This is referred to as a precoder syndrome-check. According to this, only first 4Z syndromes ($s_1, s_2, \ldots, s_{4Z}$) are calculated, and whether decoding is successfully performed/fails may be determined based thereon. As described above, although an operation associated with SPC extension is omitted or simplified, an error-correction performance may not deteriorate.

A process of applying the disclosure to an LDPC code configured based on BG2 among 3GPP NR LDPC codes will be described. In the case of an LDPC code configured based on BG2, the length of information bit vector m may be K=10Z. Z is determined based on various code parameters (code dimension, code length, code rate, or the like) given as a lifting size. In the information bit vector m, a value is fixed and a shorten bit that a transmitter and a receiver are mutually aware of may be included in. The transmitter may produce a first parity bit vector $p_i$ having a length of 4Z using a precoder, and may produce a second parity bit vector $p_2$ having a length of 38Z using SPC extension. In the case of an LDPC code configured based on BG2, the transmitter may produce a codeword bit vector x=[m p₁ p₂] having a total length of 52Z, as shown in Equation 9. The transmitter may perform puncturing of a part of a codeword bit vector based on a given coding rate or the like, and may transmit the rest. For example, the 3GPP NR system punctures first 2Z bits of a codeword bit vector x and may not transmit the same.

When a receiver performs decoding according to an embodiment of the disclosure, some or all of the operations associated with a variable node corresponding to the second parity bit vector $p_2$ may not be performed. The operation that is not performed with respect to the variable node may be V2C message calculation, AP-LLR calculation, hard-decision, a related syndrome operation, and the like. Therefore, conventionally, the number of operations required for a total of 52Z variable nodes may be reduced to 14Z by excluding 38Z variable nodes corresponding to the size of $p_2$ In an LDPC decoding apparatus embodied as a hardware such as FPGA, ASIC, SoC, or the like, variable node units (VNUs) and an AP-LLR memory buffer may be decreased by approximately 73.08%. In addition, according to an embodiment of the disclosure, the number of arithmetic operations that an LDPC decoder performs may be decreased.

Figure 10:
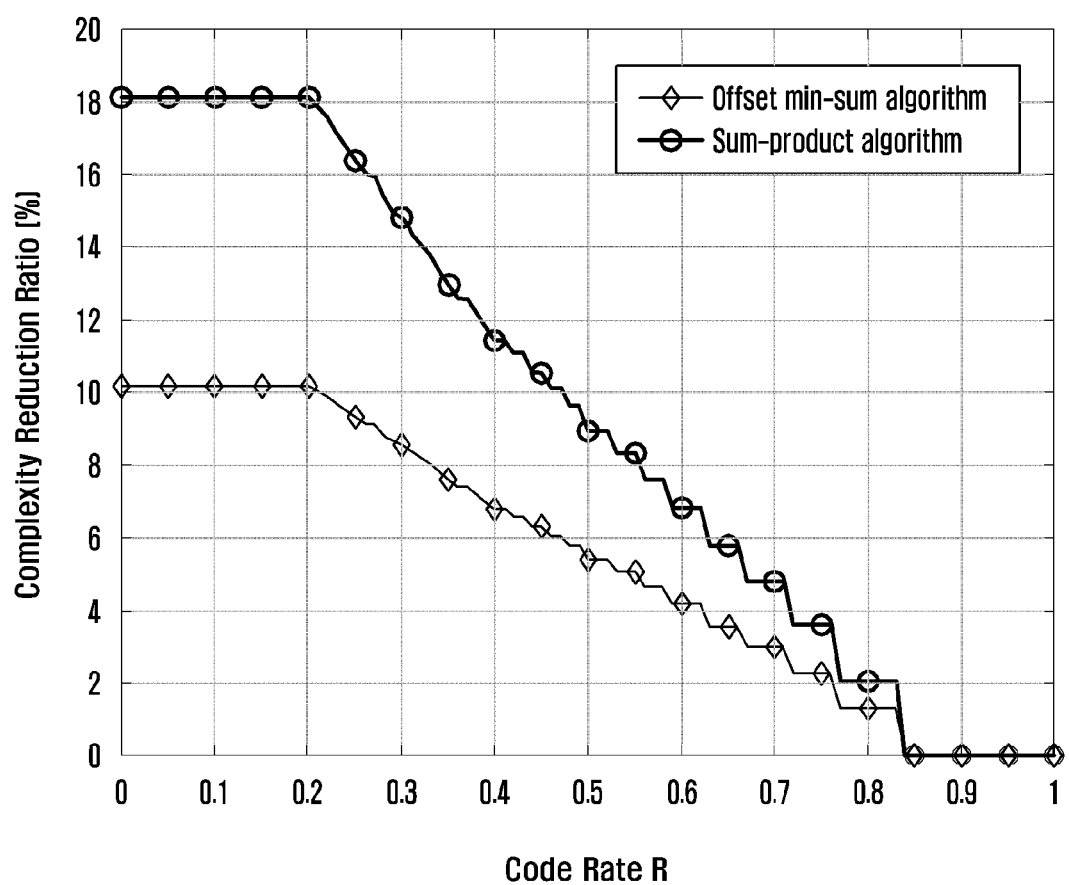
FIG. 10 is a diagram illustrating a rate of decrease in an amount of operation with variation of code rate when an embodiment of the disclosure is applied to decoding of an LDPC code configured based on base graph 2 in a 3GPP NR standard system according to an embodiment of the disclosure.

FIG. 10 is a diagram illustrating the rate of decrease in an arithmetic operation according to a code rate transmitted in a 3GPP NR LDPC code system configured based on BG2, when compared to the conventional method according to an embodiment of the disclosure. A sum-product that performs an operation such as Equation 3 and a min-sum algorithm (applying offset) that performs an operation such as Equation 4 are taken into consideration.

Referring to FIG. 10, the number of arithmetic operations may be decreased by at the maximum of 10% to 18%, depending on an algorithm. A syndrome check is performed only on a precoder which the second parity bit vector $p_2$ via SPC extension do not take part in, so that the number of times of operations may be reduced. This is referred to as a precoder syndrome-check. According to this, only first 4Z syndromes ($s_1, s_2, \ldots, s_{4Z}$) are calculated, and whether decoding is successfully performed/fails may be determined based thereon. As described above, although an operation associated with SPC extension is omitted or simplified, an error-correction performance may not deteriorate.

The disclosure may be easily applied to an LDPC code decoding that uses a scheduling scheme different from the above-described scheme. Particularly, the disclosure is to omit or simplify an operation on codeword bits (e.g., parity bits corresponding to a variable node having a degree of −1, but not necessarily) expected to have low reliability, irrespective of decoding scheduling (flooding-scheduled, layered, shuffled decoding, or the like) that an LDPC decoder uses, an algorithm (sum-product, min-sum, modified min-sum, adjusted min-sum), or a message calculation scheme (forward-backward, sum-and-substation, or the like), and to omit or simplify a required calculation device (a processor), or a memory (a storage).

An embodiment of the disclosure may be applied to a layered decoding algorithm and decoder which is another representative decoding scheme for an LDPC code. According to the flooding decoding scheme, all check nodes calculate (or update) a message, and all variable nodes calculate (or update) the message. Conversely, according to the layered decoding scheme, the procedure may be performed partially sequentially. All check nodes may be divided into subsets (disjoint subsets) that do not intersect each other according to a predetermined method, and each subset is referred to as a layer. From the perspective of a parity check matrix, each layer may be considered as a submatrix including some rows among the entire parity check matrix. The size of a layer, that is, the number of check nodes included in each layer may be the same for each layer, or may be different from each layer.

According to the layered LDPC decoding scheme, decoding may be sequentially performed with respect to each layer. Particularly, in the case of a QC-LDPC code, if each layer is configured with each Z rows of a parity check matrix as shown in FIG. 6A, this may prevent a memory conflict caused due to simultaneous accesses to the same variable node memory when a check node calculates and updates a message. In addition, in the case of a 3GPP NR LDPC code, two or more rows may be orthogonal and do not have an element different from 0 in the same row. These rows may be bound as a single layer and may be processed. From this perspective, the layered decoding scheme is widely used as a decoding algorithm for a QC-LDPC code.

```
Input: Λ = (λ₀, . . . , λ_{N−1})
Output: x̂ = (x̂₀, . . . , x̂_{A−1}) and decoding report
  1:  γ_i ← λ_i for i ∈ {1, 2, . . . , N}
  2:  β_{j→i} ← 0 for j ∈ {1, 2, . . . , N − K} and i ∈ ⟨V_j⟩
  3:  for ℓ = 1, . . . , I_{max} do
  4:    for q = φ₁, φ₂, . . . , φ_m do
  5:      for z ∈ ℤ_Z do
  6:        j ← qZ + z
  7:        α_{i→j} ← γ_i − β_{j→i} for i ∈ ⟨V_j⟩
  8:        for i ∈ ⟨V_j⟩ do
  9:          τ_i ← f ({α_{k→j}}_{k∈⟨V_j⟩\{i}})
 10:        end for
 11:        γ_i ← α_{i→j} + τ_i for i ∈ ⟨V_j⟩
 12:        β_{j→i} ← τ_i for i ∈ ⟨V_j⟩
 13:      end for
 14:    end for
 15:    x̂_i ← { 0, if γ_i ≥ 0,
               1, otherwise  . for i ∈ {1, 2, . . . , N}
 16:    s_j ← (Σ_{i∈⟨V_j⟩} x̂_i) mod 2 for j ∈ {1, 2, . . . , N − K}
 17:    if s_j = 0 for all j ∈ {1, 2, . . . , N − K} then
 18:      report decoding success; return (x̂)_{z_K}
 19:    end if
 20:  end for
 21:  report decoding failure; return (x̂)_{z_K}
```

The pseudo code illustrates a conventional normal layered decoding algorithm operation. As described above, the check node sequentially performs operations in units of layers (pseudocode Line 4-6). q in the pseudocode is the index of a layer, and the order of layers to be decoded according to the layered scheme may be determined in advance. The order of layers may be determined in order of index values, or in reverse order. Alternatively, the order of layers may be determined based on a previously designed order. The order may be denoted as $\phi_1, \phi_2, \ldots, \phi_m$ in the pseudocode. Here, m denotes the total number of layers, and may be determined based on a code parameter (code length, a code rate, or the like). Although it is assumed that the size of each layer is identical to Z in the pseudocode, this is merely an example and the disclosure is not limited thereto. As described above, it should be construed that the size of each layer may differ for each layer.

```
Input: Λ = (λ₀, . . . , λ_{N−1})
Output: x̂ = (x̂₀, . . . , x̂_{A−1}) and decoding report
  1:  γ_i ← λ_i for i ∈ {1, 2, . . . , N}
```

-continued

```
2:  β_{j→i} ← 0 for j ∈ {1, 2, ..., N − K} and i ∈ ⟨V_j⟩
3:  for ℓ = 1, ..., I_max do
4:    for q = φ_1, φ_2, ..., φ_m do
5:      for z ∈ ℤ/ℤ_Z do
6:        j ← qZ + z
7:        if q < 4 then
8:          α_{i→j} ← γ_i − β_{j→i} for i ∈ ⟨V_j⟩
9:          for i ∈ ⟨V_j⟩ do
10:           τ_i ← f ({α_{k→j}}_{k∈⟨V_j⟩(i)})
11:         end for
12:         γ_i ← α_{i→j} + τ_i for i ∈ ⟨V_j⟩
13:         β_{j→i} ← τ_i for i ∈ ⟨V_j⟩
14:       else
15:         α_{i→j} ← λ_i for i = ⟨V_j⟩_back
16:         α_{i→j} ← γ_i − β_{j→i} for i ∈ ⟨V_j⟩*
17:         for i ∈ ⟨V_j⟩* do
18:           τ_i ← f ({α_{k→j}}_{k∈⟨V_j⟩(i)})
19:         end for
20:         γ_i ← α_{i→j} + τ_i for i ∈ ⟨V_j⟩*
21:         β_{j→i} ← τ_i for i ∈ ⟨V_j⟩*
22:       end if
23:     end for
24:   end for
25:   x̂_i ← { 0, if γ_i ≥ 0,
              1, otherwise   for i ∈ {1, 2, ..., K+4Z}
26:   s_j ← (Σ_{i∈⟨V_j⟩} x̂_i) mod 2 for j ∈ {1, 2, ..., 4Z}
27:   if s_j = 0 for all j ∈ {1, 2, ..., 4Z} then
28:     report decoding success; return (x̂)_{2_K}
29:   end if
30: end for
31: report decoding failure; return (x̂)_{2_K}
```

The pseudocode illustrates an operation when an embodiment of the disclosure is applied. In the pseudocode, the following two additional symbols are used.

$\langle \mathcal{V}_j \rangle_{back}$: the last (highest) element in a set $\langle \mathcal{V}_j \rangle$ (e.g., if $\mathcal{V}_j = \{v_0, v_1, v_5\}$, $\langle \mathcal{V}_j \rangle = \{0, 1, 5\}$ and $\langle \mathcal{V}_j \rangle_{back} = 5$)

$\langle \mathcal{V}_j \rangle *$: a set of elements excluding the last (highest) element in the elements in a set $\langle \mathcal{V}_j \rangle$ (e.g., if $\mathcal{V}_j = \{v_0, v_1, v_5\}$, $\langle \mathcal{V}_j \rangle = \{0, 1, 5\}$, $\langle \mathcal{V}_j \rangle_{back} = 5$, $\langle \mathcal{V}_j \rangle * = \{0, 1\}$)

In the same manner as the above-described embodiment of the disclosure associated with the flooding decoding algorithm, the layered decoding algorithm does not perform AP-LLR production and updating, hard-decision, a related syndrome check with respect to a variable node of a second parity bit vector $p_2$ produced via SPC extension. An emphasized part in the pseudocode is to indicate a part that omits an operation associated with the second parity bit produced via SPC extension.

Figure 11:
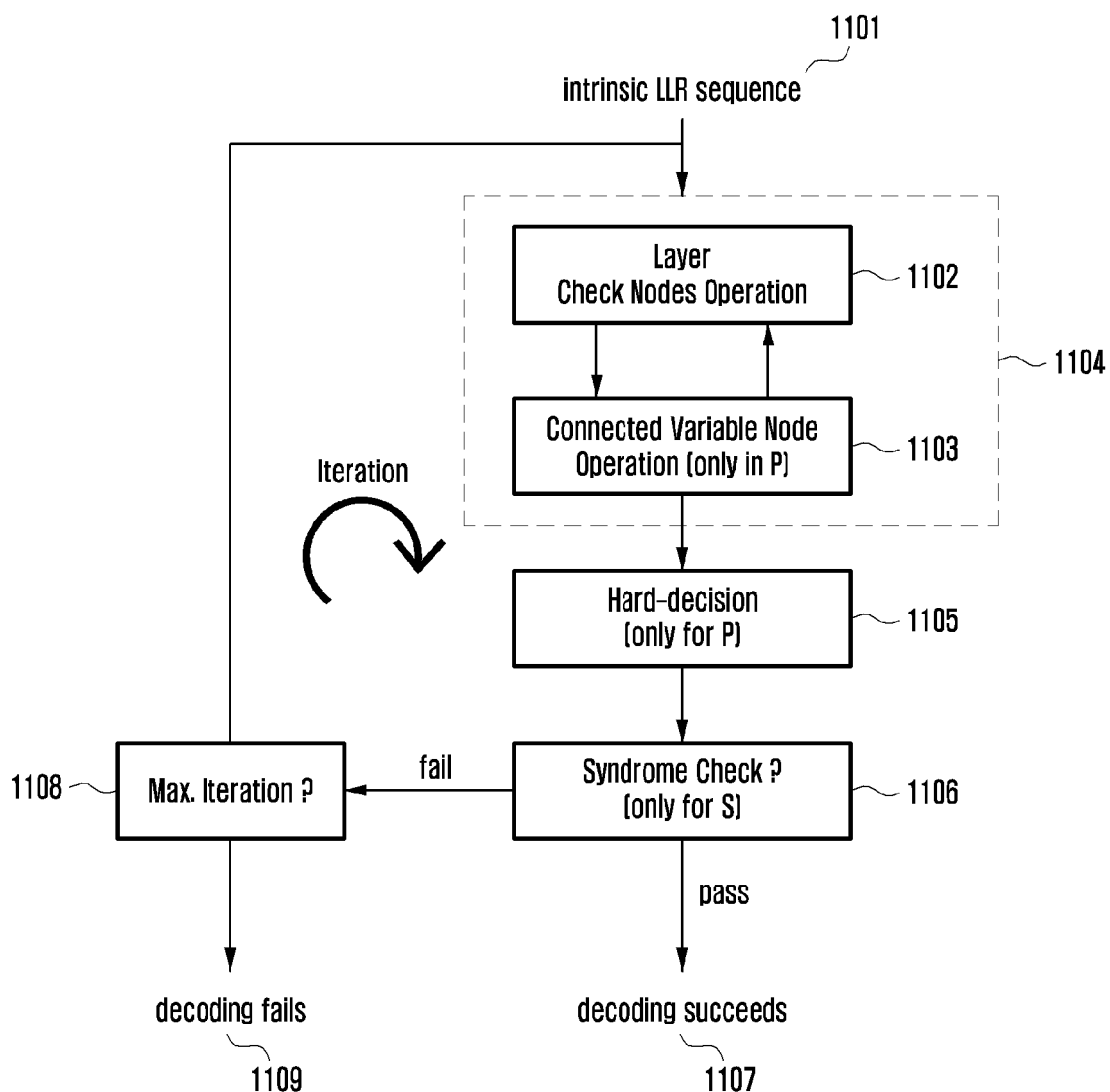
FIG. 11 is a flowchart illustrating a simplified procedure of layered scheme-based decoding on an LDPC code according to an embodiment of the disclosure.

FIG. 11 is a flowchart illustrating a layered decoding operation on an LDPC code according to an embodiment of the disclosure.

Referring to FIG. 11, the layered decoding operation sequentially performs an operation by separating the all check nodes in units of layers in operation 1104. A check node operation is performed on a selected layer first in operation 1102, and an AP-LLR of a variable node connected to the corresponding check node and a related message may be updated. In this instance, a decoder may perform a variable node operation only on a codeword bit (of which the index belongs to set $\mathcal{P}$) expected to have high reliability, and may not perform an operation on a variable node (of which the index belongs to set $\bar{\mathcal{P}}$) in operation 1103. If the operation is performed on all layers or determined layers, the decoder may perform hard-decision only on a codeword bit (of which the index belongs to set $\mathcal{P}$) expected to the high reliability in operation 1105. In addition, according to an embodiment of the disclosure, a decoding operation or decoding apparatus may perform a syndrome check on only a check node (of which the index belongs to $\mathcal{S}$) connected to only codeword bits expected to have high reliability, and may determine whether decoding is successfully performed/fails based thereon in operation 1106.

An LDPC decoding method according to an embodiment of the disclosure based on the above description may include an operation of receiving a transmitted signal of a codeword encoded into an LDPC code; an operation of producing an input of LDPC decoding such as an LLR or the like based on the transmitted signal; and an operation of performing decoding based on iterative belief-propagation using the input of the LDPC decoding, wherein the iterative belief-propagation decoding of an LDPC code may omit or simplify all or some of conventional operations performed on at least one variable nodes, for example, variable-to-check message calculation, posteriori LLR calculation, hard-decision, or the like. In addition, a syndrome check based on an estimated value of a bit corresponding to the variable node may be omitted or simplified. The variable node that omits some or all the operations may be determined based on the structure of an LDPC code, and for example, it may be a variable node of which the degree is 1.

In addition, an LDPC decoding apparatus according to an embodiment of the disclosure may receive a transmitted signal of a codeword encoded into an LDPC code; may produce an input of an LDPC decoder from the transmitted signal; may perform decoding based on iterative belief-propagation using the input of the LDPC decoding apparatus, wherein when the LDPC decoding apparatus performs the iterative belief-propagation decoding, the LDPC decoding apparatus may omit or simplify all or some of conventional operations performed on at least one variable nodes, for example, variable-to-check message calculation, posteriori LLR calculation, hard-decision, or the like. In addition, a syndrome check based on an estimated value of a bit corresponding to the variable node may be omitted or simplified. The variable node that omits some or all the operations may be determined based on the structure of an LDPC code, and for example, it may be a variable node of which the degree is 1. In FIG. 11, operations 1101, 1107, 1108 and 1109 are the same as operations 501, 507, 508 and 509 respectively.

The methods according to various embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in nonvolatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

The embodiments of the disclosure described and shown in the specification and the drawings are merely specific examples that have been presented to easily explain the technical contents of the disclosure and help understanding of the disclosure, and are not intended to limit the scope of the disclosure. That is, it will be apparent to those skilled in the art that other modifications and changes may be made thereto on the basis of the technical idea of the disclosure. Further, the above respective embodiments may be employed in combination, as necessary. For example, one embodiment of the disclosure may be partially combined with another embodiment to operate a base station and a terminal. In addition, the embodiments of the disclosure may be applied to other communication systems, and other variants based on the technical idea of the embodiments may also be implemented. For example, the embodiments may be applied to LTE, 5G, or NR systems.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by an apparatus for decoding an encoded signal in a communication system, the method comprising:
   receiving, by at least one processor of the apparatus, an encoded signal including a plurality of codeword bits;
   determining, by the at least one processor, a first log-likelihood ratio (LLR) for the plurality of codeword bits;
   determining, by the at least one processor, a first subset of the plurality of codeword bits and a second subset of the plurality of codeword bits, wherein the first subset comprises codeword bits corresponding to variable nodes of which a degree is greater than or equal to 2 in a predetermined code graph, and the second subset comprises codeword bits corresponding to variable nodes of which a degree is 1 in the predetermined code graph; and
   performing, by the least one processor, an iterative decoding a predetermined number of times based on the first LLR,
   wherein the performing of the iterative decoding comprises:
      determining, by the at least one processor, a second LLR only for codeword bits included in the first subset of the plurality of codeword bits, and
      estimating, by the at least one processor, bit values only for the codeword bits included in the first subset of the plurality of codeword bits based on the second LLR,
   wherein the plurality of codeword bits comprises first parity bits and second parity bits, and
   wherein the first subset comprises the first parity bits generated based on a precoder and the second subset comprises the second parity bits generated based on a single parity check (SPC) extension.

2. The method of claim 1, wherein the performing of the iterative decoding comprises determining whether the iterative decoding is successfully performed based on bit values estimated for the codeword bits included in the first subset.

3. The method of claim 1, wherein the performing of the iterative decoding comprises:
   skipping, by the at least one processor, determining a second LLR for the codeword bits included in the second subset of the plurality of codeword bits, and
   skipping, by the at least one processor, estimating bit values for the codeword bits included in the second subset.

4. The method of claim 1,
   wherein the plurality of codeword bits are constructed via concatenation of information bits, the first parity bits and the second parity bits.

5. The method of claim 1,
   wherein whether the iterative decoding is successfully performed is determined based on a syndrome check, and
   wherein the syndrome check is performed on an index associated with the codeword bits included in the first subset.

6. An apparatus for decoding an encoded signal in a communication system, the apparatus comprising:
   a transceiver; and
   at least one processor configured to:
      receive an encoded signal including a plurality of codeword bits,
      determine a first subset of the plurality of codeword bits and a second subset of the plurality of codeword bits, wherein the first subset comprises codeword bits corresponding to variable nodes of which a degree is greater than or equal to 2 in a predetermined code graph, and the second subset comprises codeword bits corresponding to variable nodes of which a degree is 1 in the predetermined code graph,
      determine a first log-likelihood ratio (LLR) for the plurality of codeword bits, and
      perform iterative decoding a predetermined number of times based on the first LLR,
   wherein the at least one processor is further configured to:
      determine a second LLR only for codeword bits included in the first subset of the plurality of codeword bits, and
      estimate bit values for the codeword bits included in the first subset of the plurality of codeword bits based on the second LLR,
   wherein the plurality of codeword bits comprises first parity bits and second parity bits, and
   wherein the first subset comprises the first parity bits generated based on a precoder and the second subset comprises the second parity bits generated based on a single parity check (SPC) extension.

7. The apparatus of claim 6, wherein the at least one processor is further configured to determine whether iterative decoding is successfully performed based on the bit values estimated for the codeword bits included in the first subset.

8. The apparatus of claim 6, wherein, when performing the iterative decoding, the at least one processor is further configured to:
   skip determining a second LLR for codeword bits included in the second subset of the plurality of codeword bits, and
   skip estimating bit values for codeword bits included in the second subset.

9. The apparatus of claim 6,
   wherein the plurality of codeword bits are constructed via concatenation of information bits, the first parity bits and the second parity bits.

10. The apparatus of claim 6,
   wherein whether the iterative decoding is successfully performed is determined based on a syndrome check, and
   wherein the syndrome check is performed on an index associated with the codeword bits included in the first subset.

\* \* \* \* \*